United States Patent
Valcore, Jr. et al.

(10) Patent No.: US 10,748,748 B2
(45) Date of Patent: *Aug. 18, 2020

(54) RF IMPEDANCE MODEL BASED FAULT DETECTION

(71) Applicant: Lam Research Corporation, Fremont, CA (US)

(72) Inventors: John C. Valcore, Jr., Fremont, CA (US); James Hugh Rogers, Los Gatos, CA (US); Nicholas Edward Webb, Milpitas, CA (US); Peter T. Muraoka, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/167,239

(22) Filed: Oct. 22, 2018

(65) Prior Publication Data

US 2019/0057847 A1    Feb. 21, 2019

Related U.S. Application Data

(63) Continuation of application No. 14/540,924, filed on Nov. 13, 2014, now Pat. No. 10,128,090, which is a
(Continued)

(51) Int. Cl.
*H01J 37/32*    (2006.01)
*H03J 7/00*    (2006.01)
*H05H 1/46*    (2006.01)

(52) U.S. Cl.
CPC .. *H01J 37/32926* (2013.01); *H01J 37/32146* (2013.01); *H01J 37/32183* (2013.01); *H03J 7/00* (2013.01); *H05H 2001/4682* (2013.01)

(58) Field of Classification Search
None
See application file for complete search history.

(56) References Cited

U.S. PATENT DOCUMENTS

| 5,467,013 | A | 11/1995 | Williams et al. | |
|---|---|---|---|---|
| 6,420,194 | B1 * | 7/2002 | Reitman | H01L 22/26 156/345.24 |

(Continued)

FOREIGN PATENT DOCUMENTS

TW    201129884 A    9/2011

*Primary Examiner* — Khaja Ahmad
(74) *Attorney, Agent, or Firm* — Penilla IP, APC

(57) ABSTRACT

A method to detect a potential fault in a plasma system is described. The method includes accessing a model of one or more parts of the plasma system. The method further includes receiving data regarding a supply of RF power to a plasma chamber. The RF power is supplied using a configuration that includes one or more states. The method also includes using the data to produce model data at an output of the model. The method includes examining the model data. The examination is of one or more variables that characterize performance of a plasma process of the plasma system. The method includes identifying the fault for the one or more variables. The method further includes determining that the fault has occurred for a pre-determined period of time such that the fault is identified as an event. The method includes classifying the event.

30 Claims, 9 Drawing Sheets

Related U.S. Application Data continuation-in-part of application No. 13/620,386, filed on Sep. 14, 2012, now Pat. No. 9,197,196, which is a continuation-in-part of application No. 13/531,491, filed on Jun. 22, 2012, now Pat. No. 9,114,666, which is a continuation-in-part of application No. 13/666,912, filed on Nov. 1, 2012, now Pat. No. 9,171,699, which is a continuation-in-part of application No. 13/531,491, filed on Jun. 22, 2012, now Pat. No. 9,114,666, and a continuation-in-part of application No. 13/550,719, filed on Jul. 12, 2012, now Pat. No. 9,368,329, which is a continuation-in-part of application No. 14/016,841, filed on Sep. 3, 2013, now Pat. No. 9,462,672, which is a continuation-in-part of application No. 13/620,386, filed on Sep. 14, 2012, now Pat. No. 9,197,196, and a continuation-in-part of application No. 13/666,912, filed on Nov. 1, 2012, now Pat. No. 9,171,699, which is a continuation-in-part of application No. 13/717,538, filed on Dec. 17, 2012, now Pat. No. 9,320,126, and a continuation-in-part of application No. 14/184,639, filed on Feb. 19, 2014, now Pat. No. 9,842,725, which is a continuation-in-part of application No. 13/756,390, filed on Jan. 31, 2013, now Pat. No. 9,502,216, which is a continuation-in-part of application No. 14/086,883, filed on Nov. 21, 2013, now Pat. No. 9,295,148.

(60) Provisional application No. 61/916,083, filed on Dec. 13, 2013, provisional application No. 61/602,040, filed on Feb. 22, 2012, provisional application No. 61/701,560, filed on Sep. 14, 2012, provisional application No. 61/602,041, filed on Feb. 22, 2012, provisional application No. 61/701,574, filed on Sep. 14, 2012, provisional application No. 61/799,969, filed on Mar. 15, 2013, provisional application No. 61/737,623, filed on Dec. 14, 2012.

(56) References Cited

U.S. PATENT DOCUMENTS

| | | | |
|---|---|---|---|
| 6,616,759 B2 | 9/2003 | Tanaka et al. | |
| 7,844,559 B2 | 11/2010 | Lam et al. | |
| 8,989,888 B2 | 3/2015 | Yun et al. | |
| 2002/0026251 A1* | 2/2002 | Johnson | H01J 37/32082 700/67 |
| 2003/0192475 A1* | 10/2003 | Shannon | H01J 37/32082 118/715 |
| 2004/0061448 A1* | 4/2004 | Avoyan | H01J 37/32082 315/111.21 |
| 2005/0067386 A1* | 3/2005 | Mitrovic | H01J 37/32082 219/121.43 |
| 2005/0252884 A1 | 11/2005 | Lam et al. | |
| 2006/0049831 A1 | 3/2006 | Anwar et al. | |
| 2007/0227231 A1* | 10/2007 | Koo | H01J 37/32422 73/31.05 |
| 2008/0132080 A1* | 6/2008 | Anwar | C23C 16/345 438/758 |
| 2008/0156632 A1* | 7/2008 | Van Zyl | H01J 37/32082 204/164 |
| 2009/0099991 A1 | 4/2009 | Lam et al. | |
| 2011/0083808 A1* | 4/2011 | Kagoshima | H01J 37/32926 156/345.24 |
| 2012/0000888 A1* | 1/2012 | Kawasaki | H01J 37/32082 216/67 |
| 2012/0101622 A1 | 4/2012 | Yun et al. | |

\* cited by examiner

RF IMPEDANCE MODEL BASED FAULT DETECTION

CLAIM OF PRIORITY

The present patent application is a continuation of and claims the benefit of and priority, under 35 U.S.C. § 120, to U.S. patent application Ser. No. 14/540,924, filed on Nov. 13, 2014, and titled "RF Impedance Model Based Fault Detection", which claims the benefit of and priority, under 35 U.S.C. § 119(e), to U.S. Provisional Patent Application No. 61/916,083, filed on Dec. 13, 2013, and titled "RF Impedance Model Based Fault Detection", which are incorporated by reference herein in their entirety for all purposes.

The application Ser. No. 14/540,924 is a continuation-in-part of and claims the benefit of and priority, under 35 U.S.C. § 120, to U.S. patent application Ser. No. 13/620,386, filed on Sep. 14, 2012, titled "State-based Adjustment of Power and Frequency", and now issued as U.S. Pat. No. 9,197,196, which is incorporated by reference herein in its entirety for all purposes.

The application Ser. No. 13/620,386 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The application Ser. No. 13/620,386 is a continuation-in-part of and claims the benefit of and priority, under 35 U.S.C. § 120, to U.S. patent application Ser. No. 13/531,491, filed on Jun. 22, 2012, titled "Methods and Apparatus For Controlling Plasma In A Plasma Processing System", and now issued as U.S. Pat. No. 9,114,666, which is incorporated by reference herein in its entirety for all purposes.

The application Ser. No. 14/540,924 is a continuation-in-part of and claims the benefit of and priority, under 35 U.S.C. § 120, to U.S. patent application Ser. No. 13/666,912, filed on Nov. 1, 2012, titled "Impedance-based Adjustment of Power and Frequency", and now issued as U.S. Pat. No. 9,171,699, which is incorporated by reference herein in its entirety for all purposes.

The application Ser. No. 13/666,912 claims the benefit of and priority, under 35 U.S.C. § 119(e), to U.S. Provisional Patent Application No. 61/701,560, filed on Sep. 14, 2012, and titled "Impedance-based Adjustment of Power and Frequency", which is incorporated by reference herein in its entirety for all purposes.

The application Ser. No. 13/666,912 is a continuation-in-part of and claims the benefit of and priority, under 35 U.S.C. § 120, to U.S. patent application Ser. No. 13/531,491, filed on Jun. 22, 2012, titled "Methods and Apparatus For Controlling Plasma In A Plasma Processing System", and now issued as U.S. Pat. No. 9,114,666, which is incorporated by reference herein in its entirety for all purposes.

The application Ser. No. 13/531,491 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The application Ser. No. 13/531,491 claims the benefit of and priority, under 35 U.S.C. § 119(e), to U.S. Provisional Patent Application No. 61/602,041, filed on Feb. 22, 2012, and titled "Methods and Apparatus For Synchronizing RF Pulses In a Plasma Processing System", which is incorporated by reference herein in its entirety for all purposes.

The application Ser. No. 13/666,912 is a continuation-in-part of and claims the benefit of and priority, under 35 U.S.C. § 120, to U.S. patent application Ser. No. 13/550,719, filed on Jul. 17, 2012, titled "Methods and Apparatus For Synchronizing RF Pulses In A Plasma Processing System", and now issued as U.S. Pat. No. 9,368,329, which is incorporated by reference herein in its entirety for all purposes.

The application Ser. No. 13/550,719 claims the benefit of and priority, under 35 U.S.C. § 119(e), to U.S. Provisional Patent Application No. 61/602,041, filed on Feb. 22, 2012, and titled "Methods and Apparatus For Synchronizing RF Pulses In a Plasma Processing System", which is incorporated by reference herein in its entirety for all purposes.

The application Ser. No. 14/540,924 is a continuation-in-part of and claims the benefit of and priority, under 35 U.S.C. § 120, to U.S. patent application Ser. No. 14/016,841, filed on Sep. 3, 2013, titled "Adjustment of Power and Frequency Based on Three or More States", and now issued as U.S. Pat. No. 9,462,672, which is incorporated by reference herein in its entirety for all purposes.

The application Ser. No. 14/016,841 claims the benefit of and priority, under 35 U.S.C. § 119(e), to U.S. Provisional Patent Application No. 61/701,574, filed on Sep. 14, 2012, and titled "Sub-state Based Adjustment of Power and Frequency", which is incorporated by reference herein in its entirety for all purposes.

The application Ser. No. 14/016,841 is a continuation-in-part of and claims the benefit of and priority, under 35 U.S.C. § 120, to U.S. patent application Ser. No. 13/620,386, filed on Sep. 14, 2012, titled "State-based Adjustment of Power and Frequency", and now issued as U.S. Pat. No. 9,197,196, which is incorporated by reference herein in its entirety for all purposes.

The application Ser. No. 14/016,841 is a continuation-in-part of and claims the benefit of and priority, under 35 U.S.C. § 120, to U.S. patent application Ser. No. 13/666,912, filed on Nov. 1, 2012, titled "Impedance-based Adjustment of Power and Frequency", and now issued as U.S. Pat. No. 9,171,699, which is incorporated by reference herein in its entirety for all purposes.

The application Ser. No. 14/540,924 is a continuation-in-part of and claims the benefit of and priority, under 35 U.S.C. § 120, to U.S. patent application Ser. No. 13/717,538, filed on Dec. 17, 2012, titled "Determining a Value of a Variable On an RF Transmission Model", and now issued as U.S. Pat. No. 9,320,126, which is incorporated by reference herein in its entirety for all purposes.

The application Ser. No. 14/540,924 is a continuation-in-part of and claims the benefit of and priority, under 35 U.S.C. § 120, to U.S. patent application Ser. No. 14/184,639, filed on Feb. 19, 2014, titled "Using Modeling to Determine Ion Energy Associated with a Plasma System", and now issued as U.S. Pat. No. 9,842,725, which is incorporated by reference herein in its entirety for all purposes.

The application Ser. No. 14/184,639 claims the benefit of and priority to, under 35 U.S.C. § 119(e), to U.S. Provisional Patent Application No. 61/799,969, filed on Mar. 15, 2013, and titled "Using Modeling To Determine Ion Energy Within A Plasma System", which is hereby incorporated by reference in its entirety for all purposes.

The application Ser. No. 14/184,639 is a continuation-in-part of and claims the benefit of and priority, under 35 U.S.C. § 120, to U.S. patent application Ser. No. 13/756,390, filed on Jan. 31, 2013, titled "Using Modeling to Determine Wafer Bias Associated with a Plasma System", and now issued as U.S. Pat. No. 9,502,216, which is incorporated by reference herein in its entirety for all purposes.

The application Ser. No. 14/540,924 is a continuation-in-part of and claims the benefit of and priority, under 35 U.S.C. § 120, to U.S. patent application Ser. No. 14/086,883, filed on Nov. 21, 2013, titled "Computation of Statistics for Statistical Data Decimation", and now issued as U.S. Pat. No. 9,295,148, which is incorporated by reference herein in its entirety for all purposes.

The application Ser. No. 14/086,883 claims the benefit of and priority to, under 35 U.S.C. § 119(e), to U.S. Provisional Patent Application No. 61/737,623, filed on Dec. 14, 2012, and titled "Methods of Computation of Statistics for Statistical Data Decimation", which is hereby incorporated by reference in its entirety for all purposes.

FIELD

The present embodiments relate to systems and methods for radio frequency (RF) impedance model based fault detection.

BACKGROUND

In a plasma system, a signal source generates a radio frequency (RF) signal to provide to a plasma chamber. When the signal is received by the plasma chamber, a gas within the plasma chamber is ignited to generate plasma within the plasma chamber.

The plasma is used for a wide variety of operations on a substrate, e.g., cleaning the substrate, processing the substrate, performing deposition of oxides on the substrate, etching the substrate, etc. During performance of the operations, a variety of impediments are faced. For example, there may be plasma unconfinement within the plasma chamber. As another example, there may be arcing or plasma drop-out. Such events reduce wafer yield and increase time and costs associated with performing the operations.

It is in this context that embodiments described in the present disclosure arise.

SUMMARY

Embodiments of the disclosure provide apparatus, methods and computer programs for radio frequency (RF) impedance model based fault detection. It should be appreciated that the present embodiments can be implemented in numerous ways, e.g., a process, an apparatus, a system, a device, or a method on a computer readable medium. Several embodiments are described below.

In some embodiments, the systems and methods described herein facilitate detection and classification of plasma disturbances within an RF driven plasma reactor in which RF signals are pulsed waves. An example of a pulsed signal is an amplitude modulated signal in which an amplitude of an RF signal is modulated.

The systems and methods described herein facilitate determination of multiple events, e.g., an arcing event, an unconfined plasma event, a plasma drop out event, a plasma instability event, etc. The systems and methods that use one or more pre-defined thresholds for detecting a fault or an event are used during processing of a workpiece. The pre-defined thresholds are used to detect a fault, which is classified in one of various categories. When the classified fault is determined to exist for a pre-determined time period or for a pre-determined number of times, an event is determined to occur. The event is classified based on the fault classification. The detection and classification of the fault and the event facilitates determining whether a plasma process has strayed from its normal operation. Also, the classification of event provides an identification of one or more parts of a plasma system that creates the event.

In some embodiments, a method to detect a potential fault in a plasma system is described. The method includes accessing a model of one or more parts of the plasma system. The plasma system includes a plasma chamber, an RF generator, and a transmission line between the plasma chamber and the RF generator. The method further includes receiving data regarding a supply of RF power to the plasma chamber. The RF power is supplied via the transmission line to the plasma chamber using a configuration that includes one or more states. The one or more states repeat continuously during the supply of power to the plasma chamber. The method also includes using the data to produce model data at an output of the model during the supply of RF power to the plasma chamber. The model data is associated with one of the one or more states. The method includes examining the model data during the one of the one or more states. The examination is of one or more variables that characterize performance of a plasma process of the plasma system. The method includes identifying the potential fault for the one or more variables during the one of the one or more states. The method further includes determining that the potential fault has occurred for a pre-determined period of time during the one of the one or more states, such that the potential fault is identified as an event. The method includes classifying the event.

In various embodiments, a method for determining a fault associated with a plasma system is described. The method includes receiving data associated with a supply of RF power. The data is received from a sensor. The method further includes propagating the data through a computer-generated model of one or more parts of a plasma system to determine model data at an output of the computer-generated model. The plasma system includes an RF generator, an impedance matching circuit coupled to the RF generator via an RF cable, and a plasma chamber coupled to the impedance matching circuit via an RF transmission line. The method further includes generating values associated with one or more variables from the model data, determining whether the values associated with the one or more variables meet corresponding one or more thresholds, and generating the fault upon determining that one or more values of the one or more variables fail to meet the one or more thresholds. The method includes determining whether the fault occurs for a pre-determined period of time and generating an event upon determining that the fault occurs for the pre-determined period of time. The method includes classifying the event.

In several embodiments, a plasma system is described. The plasma system includes an RF generator for generating and supplying an RF signal at an output. The RF signal is supplied using a configuration that includes one or more states. The one or more states repeat continuously during the supply of the RF signal. The plasma system further includes an impedance matching circuit connected to the RF generator for receiving the RF signal from the RF generator to generate a modified RF signal. The plasma system also includes an RF transmission line coupled to the impedance matching circuit for transferring the modified RF signal to a plasma chamber. The plasma chamber is connected to the RF transmission line for receiving the modified RF signal via the RF transmission line to generate plasma. The plasma system further includes a sensor coupled to the output of the RF generator and a host system coupled to the sensor. The host system includes a processor for accessing a model of a part of a plasma system, for receiving data from the sensor regarding the supply of the RF signal, and using the data to produce model data at an output of the model during the supply of the RF signal. The model data is associated with one of the one or more states. The processor examines the model data during the one of the one or more states. The examination is of one or more variables that characterize performance of a plasma process within the plasma chamber. The processor identifies a potential fault for the one or more variables during the one of the one or more states. The processor further determines that the potential fault has occurred for a pre-determined period of time during the one of the one or more states such that the potential fault is identified as an event. The processor classifies the event.

Some advantages of various embodiments of the systems and methods described herein include that it is not necessary to use external electrical circuitry to monitor voltages and/or current and/or optical signals. For example, an external monitor, e.g., a voltage probe, a current probe, an optical sensor, etc., that is limited in pulse compatibility and that is inhibited by bi-modal, e.g., multi state, etc., frequency tuning of RF generators and by multiple independent non-zero pulse states, are not necessary to determine whether a fault has occurred in a plasma system. As yet another example, the systems and methods, described herein, reduces a necessity to use the external monitor at a location sufficiently close to an electrode of the plasma reactor. The voltage probe provides inaccurate event detection in that an event is detected by the voltage probe in one state of an RF pulsed signal is also detected during an opposite state of the RF pulsed signal when the event has not occurred in the opposite state. As another example, there is no need to couple the external electrical circuitry to a node within a plasma system e.g., an input of an impedance matching circuit, an output of the impedance matching circuit, an RF transmission line, etc., to measure a voltage or a current at the node. The use of the external electrical circuitry is sometimes not cost-effective.

Further advantages of the herein described systems and methods include an ability to discern changes in complex voltage and current correlating to an actual event. For example, use of a model and a voltage and current probe that is accurate, e.g., a National Institute of Standards and Technology (NIST) probe, etc., helps reduce chances of detecting an event that is not actual. As another example, transforming RF Generator Output impedance, as measured by an internal RF Generator Complex Impedance monitoring circuit, e.g., a NIST probe, etc., to RF modeled variables, e.g., power, current, voltage, impedance, etc., seen at an RF driven electrode, e.g., a chuck, etc., enables plasma fault detection. The plasma fault detection is enabled by calculating RF power and impedance variables, e.g., power, current, voltage, impedance, etc., at an output of a computer-generated model of a plasma system, and correlating changes in one or more of the modeled variables to a fault in a plasma system. The modeled variables are compared with various thresholds that are associated with different faults to enable discernment of faults and events that are unique to plasma. The use of the voltage and current probe that is accurate, the computer-generated model, and the thresholds that are associated with the different faults improves chances of recognizing actual events.

Other advantages of the herein described systems and methods include providing state-based event detection. For example, different variable thresholds and/or different variable variation thresholds are used for each state of an RF signal that is generated by an RF generator. The different variable thresholds and/or the different variable variation thresholds help detect an event during different states.

Yet other advantages of the systems and methods, described herein, include considering variables along an RF path that includes an RF cable, an impedance matching circuit coupled to the RF cable, an RF transmission line coupled to the impedance matching circuit, and an electrode coupled to the RF transmission line. For example, when the external monitor is used without using the computer-generated model, described herein, to measure a variable at a position close to an impedance matching circuit, an RF path along an RF transmission line is not considered. Such lack of consideration results in a false determination of an event.

Further advantages of the systems and methods, described herein, include determining a type of an event, e.g., arcing, plasma dropout, plasma instability, plasma unconfinement, etc., and controlling a plasma system based on the type of the event. For example, when the event is determined to be arcing, an operation of the plasma system is disabled. As another example, when the event is determined to be plasma instability, an operation of a plasma tool is controlled to change an amount of power supplied to the plasma tool.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for radio frequency (RF) impedance model based fault detection. It will be apparent that the present embodiments may be practiced without some or all of these specific details. In other instances, well known process operations have not been described in detail in order not to unnecessarily obscure the present embodiments.

Figure 1A:
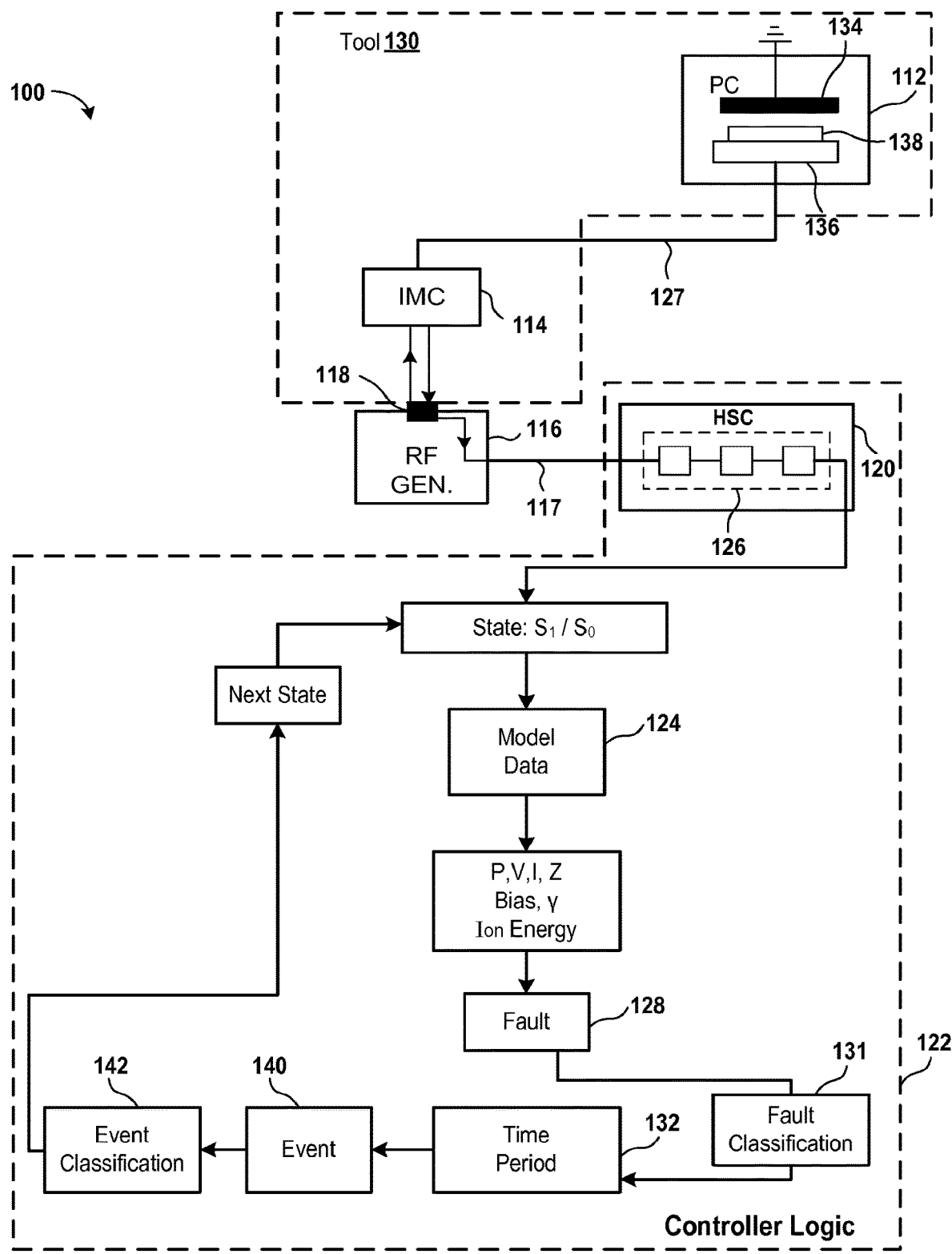
FIG. 1A is a block diagram of a plasma system for radio frequency (RF) impedance model based fault detection, in accordance with an embodiment described in the present disclosure

FIG. 1A is a block diagram of an embodiment of a plasma system 100 for RF impedance model based fault detection. The plasma system 100 includes a plasma chamber 112, an impedance matching circuit 114, one or more of the RF generators 116, and a host system 120 that is used to generate model data 124. In some embodiments, the model data 124 includes values of a variable, such as, for example, complex voltage and current, impedance, complex forward power, complex reflected power, complex delivered power, etc. In some embodiments, the complex voltage and current includes a voltage magnitude V, a current magnitude I, and a phase ϕ between the voltage and current.

In various embodiments, when RF pulsed signals are generated by the RF generators 116, the model data 124 is generated for each state of the RF pulsed signals. For example, a first set of model data is generated for a state S1 of an RF pulsed signal that is generated by one of the RF generators 116 and a second set of model data is generated for a state S0 of the RF pulsed signal.

The states S1 and S0 are continuous. For example, an instance of the state S0 sequentially follows an instance of the S1 state. In this example, another instance of the S1 state sequentially follows the instance of the S0 state.

A state, e.g., S1, etc., of an RF signal has a power level that is exclusive of, e.g., different from etc., a power level of another state, e.g., S0, etc., of the RF signal. For example, the state S1 of an RF signal has multiple power values, e.g., magnitudes, etc., that are different from multiple power values of the state S0 of the RF signal.

In some embodiments, an RF signal that is generated by one of the RF generators 116 is a continuous wave RF signal, e.g., has one state instead of two or more states, etc. As an example, the continuous wave RF signal has the state S1 or the state S0. In these embodiments, the model data 124 is generated for the continuous wave RF signal.

A process gas, e.g., an oxygen-containing gas, a fluorine-containing gas, etc. is supplied between an upper electrode 134 and a chuck 136 of the plasma chamber 112. Examples of the chuck 136 include an electrostatic chuck (ESC) and a magnetic chuck. An example of the oxygen-containing gas includes oxygen and examples of the fluorine-containing gas include tetrafluoromethane ($CF_4$), sulfur hexafluoride ($SF_6$), hexafluoroethane ($C_2F_6$), etc. Moreover, RF signals that are generated by the RF generators 116 are supplied via the impedance matching circuit 114 to the ESC 136 to generate plasma within the plasma chamber 112.

When a workpiece 138 is being processed within the plasma chamber 112, one or more sensors, e.g., probes, voltage and current probes, etc., within the RF generators 116 sense RF signals at outputs of the RF generators 116 to generate data that represents the variable. For example, a probe 118 senses RF signals at an output of one of the RF generators 116 to generate data that represents the complex voltage and current or the impedance at the output. The output of one of the RF generators 116 is used to provide an RF signal to the impedance matching circuit 114. The RF generators 116 send the data to the host system 120 via corresponding communication cables 117.

When plasma is generated in the plasma chamber 112, during the state S1 or the state S0, the host system 120 generates the model data 124 based on the data that is received from the RF generators 116. The data received includes values of a variable, examples of which are provided above. The model data 124 is generated at an output of a model 126, which is stored within a memory device of the host system 120. Examples of a memory device include a read-only memory (ROM), a random access memory (RAM), a hard disk, a volatile memory, a non-volatile memory, a redundant array of storage disks, a Flash memory, etc.

The model 126 is a computer-generated model of one or more parts of a plasma tool 130. For example, the model 126 is a computer-generated model of one or more RF cables that couple the corresponding one or more of the RF generators 116 to the impedance matching circuit 114, or of the impedance matching circuit 114, or of at least a portion of an RF transmission line 127 that couples the impedance matching circuit 114 to the plasma chamber 112, or of a lower electrode of the chuck 136. As another example, the model 126 is a computer-generated model of a combination of the one or more RF cables and the impedance matching circuit 114, or of a combination of the RF cables and the impedance matching circuit 114 and at least a portion of the RF transmission line 127, or of a combination of the one or more RF cables and the impedance matching circuit 114 and at least a portion of the RF transmission line 127 and the lower electrode of the chuck 136. As yet another example, the model 126 is a computer-generated model of a combination of the impedance matching circuit 114 and at least a portion of the RF transmission line 127, or of a combination of the impedance matching circuit 114 and at least a portion of the RF transmission line 127 and the lower electrode of the chuck 136.

One of the RF cables couples one of the RF generators 116 to the impedance matching circuit 114, another one of the RF cables couple another one of the RF generators 116 to the impedance matching circuit 114, and yet another one of the RF cables couple yet another one of the RF generators 116 to the impedance matching circuit 114.

The RF transmission line 127 includes a transmission line portion and a cylinder portion. The transmission line portion includes an RF rod that is surrounded by an RF sheath. The cylinder portion includes an RF cylinder that is connected to the RF rod via an RF strap.

A processor of the host system 120 generates the model 126 based on parameters of the one or more parts of the plasma tool 130. For example, the model 126 of the one or more parts has similar characteristics, e.g., resistances, capacitances, inductances, impedances, voltages, currents, complex voltages and currents, etc., as that of the one or more parts. As another example, the model 126 has the same number of capacitors and/or inductors as that within the one or more parts of the plasma tool 130, and the capacitors and/or inductors of the model 126 are connected with each other in the same manner, e.g., serial, parallel, etc. as that within the one or more parts. To provide an illustration, when the impedance matching circuit 114 includes a capacitor coupled in series with an inductor, the model 126 also includes a capacitor coupled in series with an inductor.

As another example, the one or more parts of the plasma tool 130 include one or more electrical components, e.g., capacitors, inductors, resistors, etc., and the model 126 includes a design, e.g., a computer-generated model, of the one or more parts. In some embodiments, the computer-generated model is generated by the processor of the host system 120 based upon input signals received from an input device, e.g., a mouse, a keyboard, a stylus, a touchpad, a keypad, etc., of the host system 120. The input device is connected to the CPU 158 via an input/output (I/O) interface. One or more selections are made by a user to generate the input signals. The input signals identify the electrical components to include in the model 126 and a manner, e.g., series, parallel, etc., of coupling the electrical components with each other. As another example, the one or more parts of the plasma tool 130 include the electrical components and hardware connections between the electrical components and the model 126 of the one or more parts includes software representations of the electrical components and of the hardware connections. In some embodiments, the electrical components include connections between resistors, connections between inductors, and/or connections between capacitors.

Based on a variable received from the sensor 118 via an RF cable and the characteristics of elements, e.g., inductors, capacitors, resistors, etc., within the model 126, the processor of the host system 120 calculates the model data 124, e.g., one or more values of a variable, etc., at the output of the model 126. For example, the processor of the host system 120 computes a sum of impedances of components of the model 126 that are in series with each other and adds the sum to an impedance value received from the sensor 118. As another example, the processor of the host system 120 computes a ratio of a product of impedances of components of the model 126 that are in parallel with each other and a sum of the impedance of the components of the model 126 that are in parallel with each other, and adds the ratio to an impedance value received from the sensor 118. As yet another example, the processor of the host system 120 computes gamma from a complex voltage and current that is received from the sensor 118. Other examples of the model data 124 include power, wafer bias, ion energy, variation in power, variation in voltage, variation in current, etc. Further examples of the model data 124 are provided below. Moreover, examples of a variation in a variable are provided below.

It should be noted that in some embodiments, a variable of the model data 124 is of the same type as that received from the sensor 118. For example, a variable of the model data 124 and that received from the sensor 118 is complex reflected power. As another example, a variable of the model data 124 and that received from the sensor 118 is complex forward power or complex delivered power or complex voltage and current.

The processor of the host system 120 accesses, e.g., reads, obtains, etc., the model data 124 from the memory device of the host system 120 and applies one or more variable thresholds, e.g., power threshold, voltage threshold, current threshold, ion energy threshold, wafer bias threshold, impedance threshold, gamma threshold, etc., and/or one or more variable variation thresholds to the model data 124 to determine, in an operation 128, whether a fault has occurred in the plasma tool 130.

In several embodiments, each threshold, described herein, is pre-determined.

In various embodiments, different thresholds are used for different states of RF pulsed signals that are generated by the RF generators 116. For example, a first value of a delivered power threshold is used when an RF pulsed signal is in a state 1 and a second value of the delivered power threshold is used when the RF pulsed signal is in a state 0.

In some embodiments, the host system 120 generates a statistical value from the model data 124 and applies one or more variable thresholds to the statistical value in a manner similar to that of applying one or more variable thresholds to the model data 124 to determine whether a fault has occurred in the plasma tool 130. For example, the host system 120 determines whether a statistical value of a current is greater than a threshold associated with the current.

Examples of a statistical value include a maximum of multiple values of the model data 124, or a minimum of the multiple values, or a mean of the multiple values, or a median of the multiple values, or a variance of the multiple values, or a standard deviation of the multiple values, or a moving mean of the multiple values, or a moving median of the multiple values, or a moving variance value of the multiple values, or a moving standard deviation value of the multiple values, or a mode of the multiple values, or a moving mode of the multiple values, or an interquartile range (IQR) generated from the multiple values, or a combination thereof, etc.

In some embodiments, the processor of the host system 120 calculates an IQR as a difference between a statistical value of an upper range of a distribution of multiple values of the model data 124 and a statistical value of a lower range of the distribution. For example, the processor of the host system 120 divides a distribution of multiple values of the model data 124 generated during a pre-determined time period into a first range, a second range, and a third range. The processor of the host system 120 calculates a first median of the first range, and a second median of the third range, and calculates an IQR as a difference between the second and first medians.

In an operation 131, the host system 120 classifies the fault that is determined in the operation 128. Examples of various classes of fault include a fault that occurs as a result of arcing of plasma within the plasma chamber 112, that occurs from plasma unconfinement, that occurs based on plasma instability, that occurs as a result of plasma dropout, etc. It should be noted that arcing, plasma unconfinement, plasma instability, and plasma dropout are examples of performance of a plasma process occurring within the plasma chamber 112. For example, during arcing, or plasma unconfinement, or plasma instability, or plasma dropout, there is a drop in efficiency in processing of the workpiece 138.

In some embodiments, plasma unconfinement is plasma leakage from a region that is surrounded by the chuck 136, the upper electrode 134 and confinement rings (not shown) located within the plasma chamber 112. A reaction chamber, e.g., a plasma reactor, etc., is formed by the chuck 136, the upper electrode 134 and the confinement rings. In various embodiments, the reaction chamber is formed using additional parts, e.g., upper electrode extension that surrounds the upper electrode 134, a lower electrode extension that surrounds the chuck 136, a dielectric ring between the upper electrode 134 and the upper electrode extension, a dielectric ring between the lower electrode extension and the chuck 136, etc. The confinement rings are located at edges of the upper electrode 136 and the chuck 136 to surround the region in which plasma is formed. In several embodiments, plasma unconfinement results in an inefficiency in processing the workpiece 138 and in a degradation to parts, e.g., walls, a pedestal that supports the chuck 136, etc., of the plasma chamber 112 that unconfined plasma comes in contact with. The degradation results in shortening in a lifetime of the parts of the plasma chamber 112.

In various embodiments, plasma instability is a change in equilibrium of plasma that occurs as a result of change in factors that affect the plasma. Examples of the factors that affect plasma include temperature, pressure, electric fields, magnetic fields, etc., within the plasma chamber 112. In some embodiments, the temperature and the pressure are controlled via temperature and pressure settings that are controlled by the processor of the host system 120.

In some embodiments, plasma arcing is thermionic emission of charge carriers, e.g., ions, electrons, etc., between the lower electrode of the chuck 136 and the upper electrode 134 or within plasma formed between the upper electrode 134 and the chuck 136. In several embodiments, plasma arcing increases inefficiencies in processing the workpiece 138 by degrading the workpiece 138, components of the reaction chamber, etc. Moreover, plasma arcing reduces a lifetime of the parts of the reaction chamber. In various embodiments, arcing refers to transient high density plasma filaments that carry electrical current between two surfaces in the plasma chamber 112 or on the workpiece 138.

In various embodiments, plasma dropout occurs when plasma cannot be sustained in the reaction chamber.

The fault that is determined during the operation 128 is classified by the processor of the host system 120 based on criteria, e.g., a magnitude of a variable, a direction of change in the magnitude, a combination of two or more variables, rate at which the magnitude changes, or a combination thereof, etc. To provide an illustration of classification of the fault, the processor of the host system 120 determines whether an impedance at the output of the model 126 is less than a pre-determined impedance threshold, whether a voltage at the output is less than a pre-determined voltage threshold, and whether a current is at the output greater than a pre-determined current threshold. Upon determining that the impedance at the output of the model 126 is less than the pre-determined impedance threshold, that the voltage at the output is less than the pre-determined voltage threshold, and that the current is at the output greater than the pre-determined current threshold, the host system 120 determines that the fault that is determined in the operation 128 is classified as arcing in the plasma chamber 112. It should be noted that the change in the voltage to be less than the pre-determined voltage threshold is an example of a direction of a magnitude of a variable. The voltage changes in a downward direction to be less than the pre-determined voltage threshold. Similarly, the change in the current to be greater than the pre-determined current threshold is an example of a direction of a magnitude of a variable. The current changes in an upward direction to be greater than the pre-determined current threshold. In some embodiments, the impedance at the output of the model 126 is less than the pre-determined impedance threshold when the impedance approaches zero, e.g., is within a pre-determined range of zero, etc.

As another illustration of classification of the fault that is determined in the operation 128, the processor of the host system 120 determines whether an impedance calculated at the output of the model 126 changes beyond a pre-determined impedance threshold to be less than or greater than the pre-determined impedance threshold. Upon determining that the impedance calculated at the output of the model 126 changes beyond the pre-determined impedance threshold, the processor of the host system 120 determines that the fault determined during the operation 128 is a plasma unconfinement fault.

As another example of classification of the fault determined in the operation 128, it is determined by the processor of the host system 120 whether voltage calculated at the output of the model 126 is less than a pre-determined voltage threshold and a current calculated at the output of the model 126 is less than a pre-determined current threshold. Upon determining that the voltage is less than the pre-determined voltage threshold and that the current is less than the pre-determined current threshold, it is determined by the processor of the host system 120 that the fault determined during the operation 128 is a plasma unconfinement fault.

As yet another example of classification of the fault determined in the operation 128, the processor of the host system 120 determines whether a magnitude of gamma calculated at the output of the model 126 is greater than a pre-determined gamma threshold and a magnitude of power calculated at the output of the model 126 is less than a pre-determined power threshold. In response to determining that the gamma magnitude is greater than the pre-determined gamma threshold and the magnitude of power is less than the pre-determined power threshold, the processor of the host system 120 determines that the fault determined in the operation 128 is a plasma dropout fault. It should be noted that in some embodiments, when the gamma magnitude is greater than the pre-determined gamma threshold, a majority of power that is supplied by the RF generator 118 is reflected towards the RF generator 118. Also, in various embodiments, the gamma magnitude is greater than the pre-determined gamma threshold during a time the RF generators 116 are turned on, e.g., operational, generating RF signals, etc.

In a number of embodiments, the amount of power that is used to determine whether a plasma dropout fault exists in the plasma tool 130 is determined based on an intensity of an optical signal instead of being calculated at the output of the model 126. The intensity is measured using an optical sensor, e.g., an optical emission spectroscopy (OES) meter, etc. The optical sensor senses optical signals of plasma that is generated in the plasma chamber 112 to generate electrical signals, which represent the intensity, and provides the electrical signals to the processor of the host system 120. The processor of the host system 120 accesses from the memory device of the host system 120 a correlation between the intensity and power for determining fault.

As another illustration of classifying the fault determined in the operation 128, the host system 120 determines whether a variation, e.g., a standard deviation, variance, an interquartile range, a change in a variable over a pre-determined time period, etc., in a magnitude of power calculated at the output of the model 126 is greater than a pre-determined power variation threshold. Upon determining that the variation in magnitude of power is greater than the pre-determined power variation threshold, the host system 120 determines that the fault determined in the operation 128 is a plasma instability fault.

As yet another illustration of classifying the fault determined in the operation 128, the host system 120 determines whether a rate of change of impedance is greater than a pre-determined rate threshold. Upon determining that the rate of change of impedance is greater than the pre-determined rate threshold, the processor of the host system 120 classifies the fault determined during the operation 128 to be plasma unconfinement. On the other hand, upon determining that the rate of change of impedance is less than the pre-determined rate threshold, the CPU 158 classifies the fault to be a plasma instability fault. It should be noted that in some embodiments, instead of the rate of change of impedance, a rate of change of another variable, e.g., power, voltage, current, is used to determine whether a fault is to be classified as plasma unconfinement or a plasma instability event.

In various embodiments, in addition to a rate of change of a variable, other criteria, e.g., the ones mentioned above to determine whether plasma unconfinement or plasma instability has occurred, etc., are used to determine whether plasma unconfinement or plasma instability has occurred. For example, upon determining that a voltage is less than a pre-determined voltage threshold, that a current is less than a pre-determined current threshold, and that a rate of change of impedance is greater than a pre-determined rate threshold, the processor of the host system 120 determines that a plasma unconfinement fault has occurred.

When the processor of the host system 120 determines that the fault that is determined in the operation 128 and classified in the operation 131 persists for an amount of time period 132 or that the fault occurs for a pre-determined number of times for which the thresholds are compared to variables or to variable variations, the processor of the host system 120 determines, during an operation 140, that an event has occurred within the plasma tool 130. For example, the processor of the host system 120 determines whether the fault determined in the operation 128 is determined based on a pre-determined number of values of one or more variables calculated at the output of the model 126 and upon determining so, the processor of the host system 120 determines that an event has occurred.

The host system 120 performs a classification operation 142 on the event determined during an operation 140 to classify the event. Examples of a class of an event include an arcing event, a plasma unconfinement event, a plasma instability event, and a plasma drop out event. A class of an event is the same as a class of a fault from which the event is determined. For example, when a fault is determined to be created as a result of arcing, an event that is determined based on the fault is an arcing event. As another example, when a fault is determined to exist as a result of plasma instability, an event that is determined based on the fault is a plasma instability event.

In various embodiments, the fault determined during the operation 128, the operation 131, the event determined during the operation 140, and/or the classification operation 142 are used to resolve or reduce an effect of the fault and/or the event.

In some embodiments, the classification operation 142 is used to determine a part of the tool 130 that creates a classified event. For example, upon classifying an event as plasma unconfinement, the processor of the host system 120 determines that the event is created by the confinement rings of the tool 130. As another example, upon determined that an event is arcing, the processor of the host system 120 determines that the event is created by the upper electrode 134, or by the lower electrode of the chuck 136, or a combination thereof. As yet another example, upon determining that an event is plasma instability, the processor of the host system 120 determines that the event is created by one of the RF generators 116, or one of the RF cables, or the impedance matching circuit 114, or the RF transmission line 127, or a temperature setting within the plasma chamber 112, or a pressure setting within the plasma chamber 112, or a combination thereof. As another example, upon classifying an event to be a plasma dropout event, the processor of the host system 120 determines that the event is created by one of the RF generators 116, or one of the RF cables, or the impedance matching circuit 114, or the RF transmission line 127, or a power setting of the RF generator, or a combination thereof.

In some embodiments, the classification operation 142 is used to determine whether to turn off power that is supplied to the plasma tool 130 or to change an amount of power or frequency that is supplied to the plasma tool 130. For example, upon determining that an event is arcing, the processor of the host system 120 sends a control signal to one or more of the RF generators 116 to turn off the one or more RF generators 116. As another example, upon determining that an event is plasma dropout or plasma instability, the processor of the host system 120 sends a control signal to one or more of the RF generators 116 to change an amount of power supplied by or a frequency of one or more RF signals that are supplied by the corresponding one or more RF generators 116. As yet another example, in response to determining that an event is determined to be plasma dropout, the processor of the host system 120 sends a control signal to one or more of the RF generators 116 to turn off the one or more RF generators 116. As another example, upon determining that an event is a plasma dropout event, the processor of the host system 120 sends a control signal to one or more of the RF generators 116 to change power and/or frequency of one or more RF signals supplied by the corresponding one or more RF generators 116.

In several embodiments, in case an event is determined to be an arcing event, e.g., a microarcing event, etc., the processor of the host system 120 sends a control signal to one or more of the RF generators 116 to change an amount of power supplied by or a frequency of one or more RF signals supplied by the corresponding one or more RF generators 116.

In various embodiments, after performing the classification operation 142 for a state of an RF pulsed signal, model data is generated for a different consecutive state, e.g., the state S1, the state S0, etc., of the RF pulsed signal by the processor of the host system 120. The consecutive state is different from a preceding state, which precedes the consecutive state. For example, when the preceding state is the state S1, the consecutive state is the state S0. As another example, when the preceding state is the state S0, the consecutive state is the state S1. The model data is used to determine a fault during the consecutive state and the fault is classified during the consecutive state. Moreover, the classified fault is used to determine whether an event has occurred during the consecutive state and the event is also classified during the consecutive state.

In some embodiments, after performing the classification operation 142 for a state of a continuous wave RF signal, model data is generated again for the same state of the continuous wave RF signal by the processor of the host system 120, and the operations 128, 131, 140, and 142 are repeated for the state. The re-generation of the model data 124 and the repeat of the operations 128, 131, 140, and 142 for the state are done after a pre-determined amount of time, or in synchronization with a clock signal, or after execution of the operation 142.

In some embodiments, the processor of the host system 120 executes or operates a controller logic 122 of the host system 120 to generate the model data 124, to generate a fault during the operation 128, to determine whether the fault exists for the pre-determined time period 132 or for a pre-determined number of times, to generate an event during the operation 140, and to perform the classification operation 142. In various embodiments, the controller logic 122 is executed using an application specific integrated circuit (ASIC), or using a programmable logic device (PLD), or using a field programmable gate array (FPGA), or using the processor of the host system 120, or as a software stored on a computer-readable medium. In some embodiments, the controller logic 122 is executed using hardware, or software, or a combination of hardware and software.

Figure 1B:
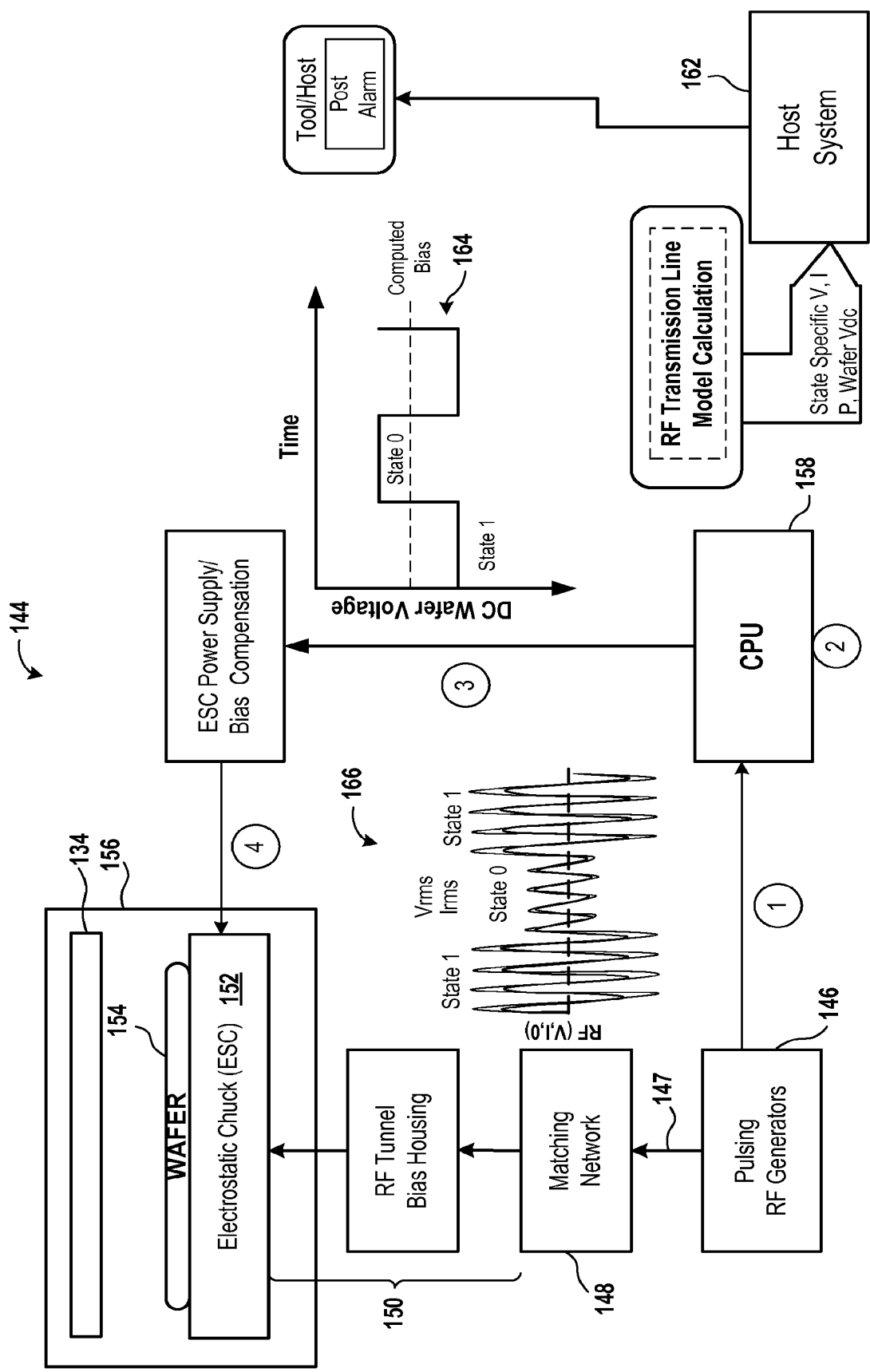
FIG. 1B is a block diagram of a plasma system for RF impedance model based fault detection, in accordance with an embodiment described in the present disclosure.

FIG. 1B is a block diagram of an embodiment of a plasma system 144 for radio frequency (RF) impedance model based fault detection. The plasma system 144 is an example of the plasma system 100 (FIG. 1). The plasma system 144 includes one or more RF generators 146, e.g., an x MHz RF generator, a y MHz RF generator, and a z MHz RF generator. The RF generators 146 are examples of the RF generators 116 (FIG. 1A). An example of the x MHz RF generator includes an RF generator that has an operation frequency of 2 MHz, an example of the y MHz RF generator includes an RF generator that has an operation frequency of 27 MHz, and an example of the z MHz RF generator includes an RF generator that has an operation frequency of 60 MHz.

The pulsing RF generators 146 are coupled to an impedance matching network 148 via one or more corresponding RF cables 147. The impedance matching network 148 is an example of the impedance matching circuit 114 (FIG. 1A).

The impedance matching network 148 is connected via an RF transmission line 150 to an electrostatic chuck (ESC) 152 of a plasma chamber 156, which is an example of the plasma chamber 112 (FIG. 1A). The RF transmission line 150 is an example of the RF transmission line 127 (FIG. 1A). The ESC 152 is an example of the chuck 136 (FIG. 1A). The ESC 152 includes a lower electrode. In some embodiments, the ESC 152 includes the lower electrode and a ceramic layer placed with respect to, e.g., on top of, etc., the lower electrode. In various embodiments, the ESC 152 includes the lower electrode, the ceramic layer, and a facility plate placed with respect to, e.g., below, etc., the lower electrode.

In some embodiments, the RF transmission line 150 includes an RF tunnel and a bias housing. In various embodiments, an RF rod that extends through the RF tunnel is coupled via an RF strap to the bias housing. In these embodiments, the bias housing includes an RF cylinder that is coupled to the RF strap at one end and to the ESC 152 at another end.

In various embodiments, the lower electrode of the ESC 152 is made of a metal, e.g., anodized aluminum, alloy of aluminum, etc. Also, the upper electrode 134 (FIG. 1A) is made of a metal, e.g., aluminum, alloy of aluminum, etc. The upper electrode 134 is located opposite to and facing the lower electrode of the ESC 152.

A wafer 154 is placed on a top surface 156 of the ESC 152 for processing, e.g., depositing materials on the wafer 154, or cleaning the wafer 154, or etching deposition layers on the wafer 154, or doping the wafer 154, or implantation of ions on the wafer 154, or creating a photolithographic pattern on the wafer 154, or etching the wafer 154, or sputtering the wafer 154, or a combination thereof. In some embodiments, a workpiece, e.g., a wafer overlaid with vias or communication mediums, etc., is used instead of a wafer to process the workpiece.

The upper electrode 134 faces the ESC 152 and is grounded, e.g., coupled to a reference voltage, coupled to zero voltage, coupled to a negative voltage, etc. For example, a lower surface of the upper electrode 134 is suspended to face the upper surface 156 of the ESC 152.

The plasma system 144 further includes a central processing unit (CPU) 158 that is coupled to the RF generators 146 via one or more cables. As used herein, in some embodiments, instead of a CPU, a computer, a processor, a controller, an ASIC, or a PLD is used, and these terms are used interchangeably herein. In various embodiments, the CPU 158 is part of a host system 162 or is part of an RF generator of the plasma system 144 or is within a computer or is within a server or is within a cloud network. The host system 162 is an example of the host system 120 (FIG. 1A). Examples of the host system 162 include a computer, e.g., a desktop computer, a cell phone, a smart phone, a laptop computer, a tablet, etc.

In some embodiments, instead of a host system, a server or a virtual machine is used. For example, the server or virtual machine executes the same functions described herein as performed by the host system 162. A computer-generated model is generated by a processor of the host system 162 and stored within a memory device of the host system 162. Examples of the computer-generated model include a model of the RF cables 147, or a model of the impedance matching network 148, or a model of the RF transmission line 150, or a model of the ESC 152, or a combination thereof. The computer-generated model that is generated by the CPU 158 is an example of the model 126 (FIG. 1A).

The CPU 158 generates a pulsed signal 164 and provides the pulsed signal 164 to the RF generators 146. The RF generators 146 generate one or more RF signals, e.g., an RF signal 166, etc., based on the pulsed signal 164. For example, the RF signal 166 is generated by one of the RF generators 146 synchronous with the reception of the pulsed signal 164 by the RF generator. As another example, a phase of an envelope of the RF signal 166 is the same as a phase of an envelope of the pulsed signal 164. In some embodiments, each RF signal is sinusoidal or is substantially sinusoidal during each of the states S1 and S0. In various embodiments, the pulsed signal 164 is a transistor-transistor logic (TTL) signal.

In some embodiments, each RF signal that is generated by a respective one of the RF generators 146 has two states, e.g., a state 1 and a state 0, a high state and a low state, etc. For example, multiple power values of an RF signal that is generated by one of the RF generators 146 during the state 1 are exclusive of multiple power values of an RF signal that is generated by the RF generator during the state 0. In some embodiments, a transition between one state and another state of an RF signal that is generated by one of the RF generators 146 is a vertical transition having an infinite slope. In various embodiments, a transition between one state and another state of an RF signal that is generated by one of the RF generators 146 is a substantially vertical transition that has a slope having an incline from the state 0 to the state 1 of greater than 45 degrees or a decline from the state 1 to low state 0 of less than −45 degrees.

It should be noted that the state 0 and the low state are examples of the state S0, and the state 1 and the high state are examples of the state S1.

In some embodiments, each RF signal that is generated by a respective one of the RF generators 146 is a continuous wave RF signal, which has a single state, e.g., the state S0 or the state S1, etc.

The impedance matching network 148 receives the RF signals from the RF generators 146 and matches an impedance of a load connected to an output of the impedance matching network 148 with that of a source connected to an input of the impedance matching network 148 to generate a modified RF signal. Examples of the source include the RF generators 146 and the RF cables 147. Examples of the load include the RF transmission line 150 and the plasma chamber 156. The modified RF signal is provided by the impedance matching network 148 via the RF transmission line 150 to the ESC 152.

The ESC 152 receives the modified RF signal and upon an introduction of a process gas within the plasma chamber 112, plasma is stricken within the plasma chamber 112. The plasma is used to process the wafer 154.

The RF generators 146 include sensors that measure a variable, e.g., a complex voltage and current, impedance, etc., at corresponding outputs of the RF generators 146. For example, one of the RF generators 146 includes a National Institute of Standards and Technology (NIST) probe that measures a voltage magnitude, a current magnitude, and a phase between the voltage magnitude and current magnitude and that is connected to an output of the RF generator. In some embodiments, a sensor that measures complex voltage and current at an output of one of the RF generators 146 is a National Institute of Standards and Technology (NIST)-traceable probe that is placed internally in the RF generator. For example, a sensor is NIST-traceable when a variable measured by the sensor has an error. The variable and the error are comparable to a variable and an error measured by a probe that rigidly follows NIST standards. The probe rigidly follows NIST standards when the probe is compared to a widely-known and a widely-adopted standard that is developed by NIST. In various embodiments, a sensor that measures complex voltage and current at an output of one of the RF generators 146 is a NIST-traceable probe that is placed outside the RF generator and is coupled to an output of the RF generator. As another example, one of the RF generators 146 includes a NIST probe or a NIST-traceable probe that measures complex power, e.g., complex reflected power, complex supplied power, complex delivered power, etc.

The CPU 158 receives a variable that is measured by the sensors via communication cables that couple the corresponding sensors to the host system 162, accesses a computer-generated model, e.g., the model 126 (FIG. 1A), etc., from the memory device of the host system 162, and propagates the variable, e.g., complex voltage and current, complex reflected power, complex forward power, complex delivered power, etc., through the computer-generated model to generate the model data 124 (FIG. 1A). For example, a directional sum of a complex voltage and current at an input model node of the model 126 and of complex voltages and currents of components, e.g., capacitors, inductors, resistors, etc., of the model 126 is calculated by the CPU 158 to generate a complex voltage and current at an output model node of the model 126. The complex voltage and current at the input model node of the model 126 is received from one of the sensors. As another example, a directional sum of a type of complex power, e.g., complex reflected power, complex delivered power, complex forward power, etc. at an input model node of the model 126 and of the same type of complex power of components, e.g., capacitors, inductors, resistors, etc., of the model 126 is calculated by the CPU 158 to generate a complex power at an output model node of the model 126. The complex power at the input model node of the model 126 is received from one of the sensors. As another example, a sum of impedances of components of the model 126 in series is calculated by the CPU 158 and is added by the CPU 158 to an impedance that is measured by the NIST-traceable probe to forward propagate the measured impedance via the model 126. As another example, a ratio of a product of impedances of components of the model 126 in parallel and a sum of the impedances is added by the CPU 158 to an impedance that is measured by the NIST-traceable probe to forward propagate the measured impedance via the model 126. In this example, the ratio and the sum of the impedances are calculated by the CPU 158.

In various embodiments, a variable, e.g., model bias, modeled wafer direct voltage (wafer Vdc), complex power, complex voltage, complex current, complex delivered power, complex supplied power, complex reflected power, an impedance, gamma, ion energy, voltage standing wave ratio (VSWR), etc., is calculated at a model node, e.g., the output of the model 126, etc., by the CPU 158 based on a complex voltage and current at the model node.

In some embodiments, complex power, e.g., a complex delivered power, etc., at a model node is determined by the CPU 158 as a function, e.g., a product, etc., of a complex current at the model node and a complex voltage at the model node. In various embodiments, complex power delivered by an RF generator is calculated by the CPU 158 as a difference between complex power of an RF signal supplied by one of the RF generators 146 and complex power reflected towards the RF generator. In several embodiments, complex impedance at a model node is calculated by the CPU 158 as a ratio of a complex voltage at the model node to a complex current at the model node. In various embodiments, a square of gamma is calculated by the CPU 158 as being equal to a ratio of complex power reflected towards an RF generator to complex power supplied by the RF generator. In several embodiments, a complex voltage or a complex current at a model node is extracted, e.g., parsed, etc., from a complex voltage and current at the model node.

In some embodiments, when the 2 MHz RF generator is used and the 27 and 60 MHz RF generators are not used, a wafer bias, e.g., model bias, wafer Vdc, etc., is determined by the CPU 158 using an equation a2*V2+b2*I2+c2*sqrt (P2)+d2, where "*" represents multiplication, sqrt represents a square root, "V2" represents voltage at the output of the model 126 when the 2 MHz RF generator is on and the 27 MHz and 60 MHz RF generators are off, "I2" represents current at the output of the model 126 when the 2 MHz RF generator is on and the 27 MHZ and 60 MHz RF generators are off, P2 represents power at the output of the model 126 when the 2 MHz RF generator is on and the 27 MHZ and 60 MHz RF generators are off, "a2" is a pre-determined coefficient, "b2" is a pre-determined coefficient, "c2" is a pre-determined coefficient, and "d2" is a pre-determined constant value.

In various embodiments, when the 2 MHz and 27 MHz RF generators are used and the 60 MHz RF generator is not used, a wafer bias is determined by the CPU 158 using an equation a227*V2+b227*I2+c227*sqrt(P2)+d227*V27+ e227*I27+f227*sqrt(P27)+g227, where "V27" represents voltage at an output of the model 126 when the 27 MHz RF generator is on and the 2 MHz and 60 MHz RF generators are off, "I27" represents a current at the output of the model 126 when the 27 MHz RF generator is on and the 2 MHz and 60 MHz RF generators are off, "P27" represents power at the output of the model 126 when the 27 MHz RF generator is on and the 2 MHz and 60 MHz RF generators are off, "a227", "b227", "c227", "d227", "e227" and "f227" are pre-determined coefficients, and "g304" is a pre-determined constant value.

In several embodiments, when the 2 MHz, 27 MHz, and 60 MHz RF generators are used, a wafer bias is determined by the CPU 158 using an equation a22760*V2+b22760*I2+ c22760*sqrt(P2)+d22760*V60+e22760*I60+f22760*sqrt (P60)+g22760*V27+h22760*I27+i22760*sqrt(P27)+ j22760, "V60" represents voltage at the output of the model 126 when the 60 MHz RF generator is on and the 2 MHz and 27 MHz RF generators are off, "160" represents a current at the output of the model 126 when the 60 MHz RF generator is on and the 2 MHz and 27 MHz RF generators are off, P60 represents power at the output of the model 126 when the 60 MHz RF generator is on and the 2 MHz and 27 MHz RF generators are off, "a22760", "b22760", "c22760", "d22760", "e22760" and "f22760", "g22760", "h22760", and "i22760" are pre-determined coefficients and "j22760" is a pre-determined constant value.

In some embodiments, an ion energy is determined by the CPU 158 as a function of a wafer bias and an RF voltage, e.g., V2, V27, V60, etc., used to calculate the wafer bias. For example, the CPU 158 determines the ion energy as $Ei = (-1/2)Vdc + (1/2)Vpeak$, where Ei is the ion energy, and Vpeak is a peak voltage, e.g., zero-to-peak voltage, peak-to-peak voltage, V2, V27, V60, etc., etc., used to calculate a wafer bias.

The CPU 158 determines whether a fault has occurred in the plasma system 144 based on one or more variables generated at the output of the model 126. For example, the CPU 158 determines a fault has occurred in the plasma system 144 when a variation in a variable exceeds a variation threshold. In this example, the CPU 158 determines that the fault has not occurred when the variation does not exceed the variation threshold. Examples of a variation in a variable include a standard deviation of the variable, a variance of the variable, and an error in the variable. As another example, the CPU 158 determines that a fault has occurred in the plasma system 144 when a variation in a variable does not exceed a variation threshold. In this example, the CPU 158 determines that the fault has not occurred when the variation exceeds the variation threshold.

As another example, the CPU 158 determines that a fault has occurred in the plasma system 144 when one or more variations in corresponding one or more variables are greater than one or more corresponding variation thresholds. In this example, the CPU 158 determines that a fault has not occurred in the plasma system 144 when the one or more variations in the corresponding one or more variables are not greater than the one or more corresponding variation thresholds. As another example, the CPU 158 determines that a fault has occurred in the plasma system 144 when one or more variations in corresponding one or more variables are not greater than, e.g., less than, etc., one or more corresponding variation thresholds. In this example, the CPU 158 determines that the fault has not occurred in the plasma system 144 when the one or more variations in the corresponding one or more variables are greater than the one or more corresponding variation thresholds.

As yet another example, the CPU 158 determines that a fault has occurred in the plasma system 144 when a variable is less than a threshold. As another example, the CPU 158 determines that a fault has occurred in the plasma system 144 when a variable is not greater than a threshold. As another example, the CPU 158 determines that a fault has occurred in the plasma system 144 when one or more variables are greater than one or more corresponding thresholds. As yet another example, the CPU 158 determines that a fault has occurred in the plasma system 144 when one or more variables are not greater than, e.g., are less than, etc., one or more corresponding thresholds.

As another example, the CPU 158 determines that a fault has occurred in the plasma system 144 when one or more variations in corresponding one or more variables are greater than one or more corresponding variation thresholds and when one or more variables are greater than corresponding one or more thresholds. In this example, the CPU 158 determines that the fault has not occurred in the plasma system 144 when the one or more variations in the corresponding one or more variables are not greater than the one or more corresponding variation thresholds and when the one or more variables are not greater than the corresponding one or more thresholds. As another example, the CPU 158 determines that a fault has occurred in the plasma system 144 when one or more variations in corresponding one or more variables are not greater than one or more corresponding variation thresholds and when one or more variables are greater than corresponding one or more thresholds. In this example, the CPU 158 determines that the fault has not occurred in the plasma system 144 when the one or more variations in the corresponding one or more variables are greater than the one or more corresponding variation thresholds and when the one or more variables are not greater than the corresponding one or more thresholds. As another example, the CPU 158 determines that a fault has occurred in the plasma system 144 when one or more variations in corresponding one or more variables are greater than one or more corresponding variation thresholds and when one or more variables are not greater than corresponding one or more thresholds. In this example, the CPU 158 determines that the fault has not occurred in the plasma system 144 when the one or more variations in the corresponding one or more variables are not greater than the one or more corresponding variation thresholds and when the one or more variables are greater than the corresponding one or more thresholds. As another example, the CPU 158 determines that a fault has occurred in the plasma system 144 when one or more variations in corresponding one or more variables are not greater than one or more corresponding variation thresholds and when one or more variables are not greater than, e.g., are less than, etc., corresponding one or more thresholds. In this example, the CPU 158 determines that the fault has not occurred in the plasma system 144 when the one or more variations in the corresponding one or more variables are greater than the one or more corresponding variation thresholds and when the one or more variables are greater than the corresponding one or more thresholds.

In some embodiments, the CPU 158 determines that an event has occurred when a fault occurs for a pre-determined period of time or when a fault repeats for a pre-determined number of times. For example, the CPU 158 determines whether a number of samples of complex delivered power is greater than a threshold for a pre-determined amount of time. Upon determining that the number of samples of complex delivered power is greater than a threshold for a pre-determined amount of time, the CPU 158 determines that an event has occurred. On the other hand, upon determining that the number of samples of complex delivered power is not greater than a threshold for a pre-determined amount of time, the CPU 158 determines that an event has not occurred. As another example, the CPU 158 determines whether a pre-determined number of samples of complex delivered power is greater than a threshold. Upon determining that the pre-determined number of samples of complex delivered power is greater than a threshold, the CPU 158 determines that an event has occurred. On the other hand, upon determining that the pre-determined number of samples of complex delivered power is not greater than a threshold, the host system 162 determines that an event has not occurred.

In various embodiments, in the examples above describing whether an event has occurred, instead of performing a greater than determination, a not greater than, e.g., a less than, a less than or equal to, etc., determination is performed to determine whether an event has occurred.

In several embodiments, in the examples above describing whether an event has occurred, instead of comparing a number of samples of a variable with a threshold, a number of samples of variations in a variable is compared with a variation threshold.

In various embodiments, an occurrence of an event is used to compensate for the event. For example, upon determining that an event has occurred when a variable is greater than a threshold, the variable is controlled to be less than or equal to the threshold. As another example, upon determining that an event has occurred when a variable is less than a threshold, the variable is controlled to be greater than or equal to the threshold. As yet another example, upon determining that an event has occurred when a variation in a variable is less than a variation threshold, the variation is controlled to increase the variation to be greater than or equal to the variation threshold. As another example, upon determining that an event has occurred when a variation in a variable is greater than a variation threshold, the variation is controlled to decrease the variation to be less than or equal to the variation threshold.

In some embodiments, once it is determined that an event has occurred, the CPU 158 generates an alarm. For example, the CPU 158 displays, on a display device, of the host system 162 that an event has occurred. Examples of a display device include a cathode ray tube (CRT), a light emitting diode (LED) display device, a liquid crystal display (LCD) display device, a plasma display device, etc. In some embodiments, the display device lists a type, e.g., a class, etc., of an event and an amount of time since the occurrence of the event. As another example, the CPU 158 generates an audio alarm, via an audio playback device and audio speakers, etc., that an event has occurred. As another example, the CPU 158 sends a signal to a remote host system via a computer network, e.g., a local area network, a wide area network, etc., that an event has occurred to indicate an alarm. The remote host system receives the signal via the computer network and displays on a display device of the remote host system that the event has occurred.

In various embodiments, a variable is controlled by controlling an amount of power supplied by an RF generator. For example, the CPU 158 identifies from the memory device of the host system 162 an amount of complex power to be supplied by the x MHz RF generator based on a value of a variable, and supplies the amount to the x MHz RF generator. A digital signal processor (DSP) of the x MHz RF generator receives the amount and provides the amount to an RF power supply within the x MHz RF generator. The RF power supply generates an RF signal based on the amount of power and supplies the RF signal via one of the RF cables 147 that is connected to the x MHz RF generator to the impedance matching network 148. The impedance matching network 148 matches an impedance of the load with that of the source to generate a modified RF signal based on the RF signal received from the RF power supply of the x MHz RF generator. The ESC 152 of the plasma chamber 156 receives the modified RF signal from the impedance matching network 148 and modifies plasma within the plasma chamber 156 to achieve the value of the variable.

Figure 1C:
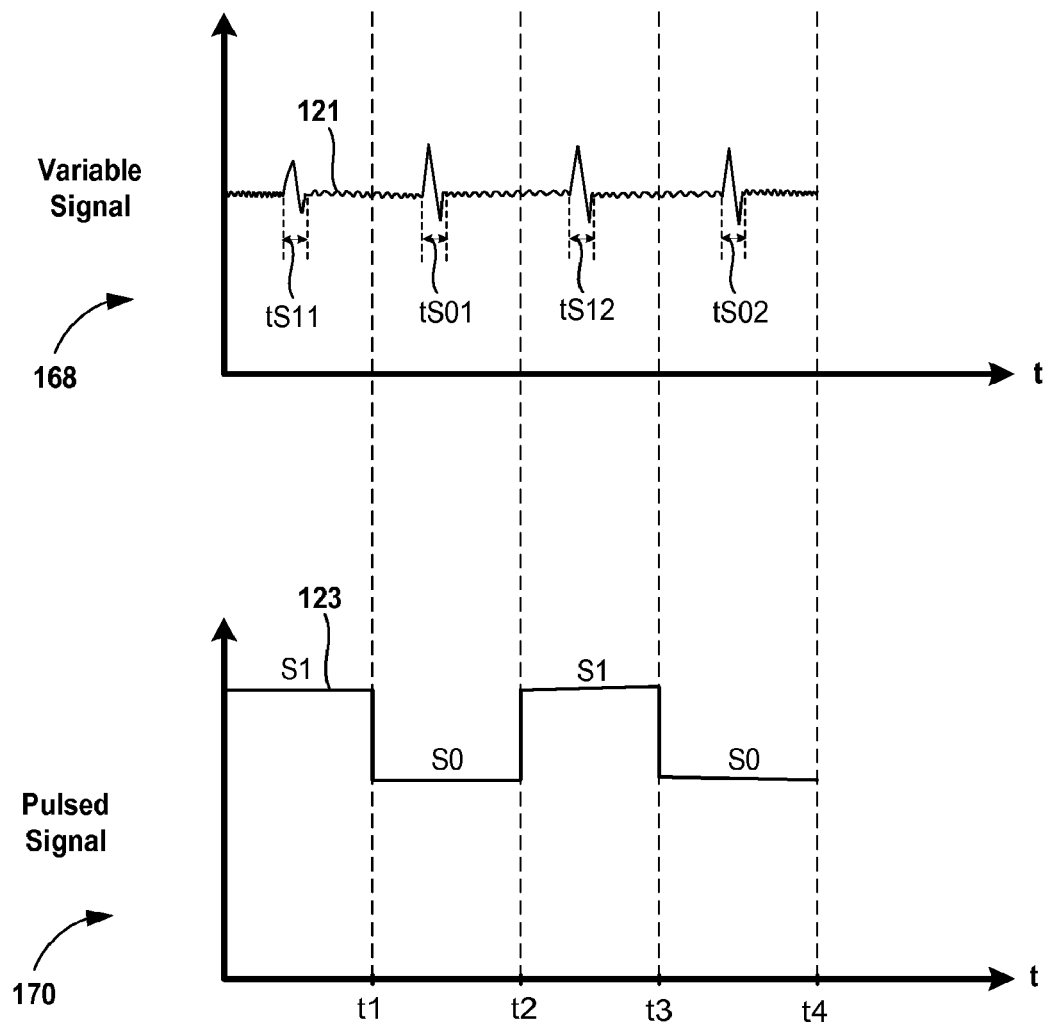
FIG. 1C shows graphs to illustrate generation of an event from a fault for multiples states of an RF pulsed signal, in accordance with an embodiment described in the present disclosure.

FIG. 1C shows embodiments of graphs 168 and 170 to illustrate generation of an event based on a fault for different states of an RF pulsed signal of an RF generator. The graph 168 plots a signal 121 of a variable versus time t and the graph 170 plots an envelope of an amplitude of an RF pulsed signal 123 over the time t. In some embodiments, the graphs 168 and 170 are plotted over the same time period.

The RF pulsed signal 123 has multiple states, e.g., a state S1, a state S0, etc., that alternate consecutively. For the state S1, a fault is generated for a time period tS11, and for the state S0 that is consecutive to the state S1, a fault is generated for a time period tS01, and for a following state S1 that is consecutive to the state S0, a fault is generated for a time period tS12, and for a following state S0 that is consecutive to the following state S1, a fault is generated for a time period tS02.

In some embodiments, the CPU 158 (FIG. 1B) determines whether an event has occurred for each state of an RF pulsed signal. For example, the CPU 158 sums the time periods tS11 and tS12 for the state S1, and determines whether the sum exceeds a pre-determined amount of time. Upon determining that the sum exceeds the pre-determined amount of time, the CPU 158 determines that an event has occurred. On the other hand, upon determining that the sum does not exceed the pre-determined amount of time, the CPU 158 determines that the event has not occurred. As another example, the CPU 158 sums the time periods tS01 and tS02 for the state S0, and determines whether the sum exceeds a pre-determined amount of time. Upon determining that the sum exceeds the pre-determined amount of time, the CPU 158 determines that an event has occurred. On the other hand, upon determining that the sum does not exceed the pre-determined amount of time, the CPU 158 determines that the event has not occurred.

In various embodiments, the CPU 158 determines whether an event has occurred for multiple states of an RF pulsed signal. For example, the CPU 158 sums the time periods tS11 and tS01 for the states S1 and S0, and determines whether the sum exceeds a pre-determined amount of time. Upon determining that the sum exceeds the pre-determined amount of time, the CPU 158 determines that an event has occurred. On the other hand, upon determining that the sum does not exceed the pre-determined amount of time, the CPU 158 determines that the event has not occurred.

In some embodiments, a pre-determined number of times used to determine whether an event has occurred includes a pre-determined number of times for which a fault is generated for a state, e.g., S1 or S0. For example, when a fault is generated for two consecutive states, where both the states are S0, it is determined by the CPU 158 that the fault has occurred for two times.

In various embodiments, a pre-determined number of times used to determine whether an event has occurred includes a pre-determined number of times for which a fault is generated for multiple states, e.g., S1 and S0. For example, when a fault is generated for two consecutive states, where a first state is S1 and a second state is S0, it is determined by the CPU 158 that the fault has occurred for two times.

Figure 2:
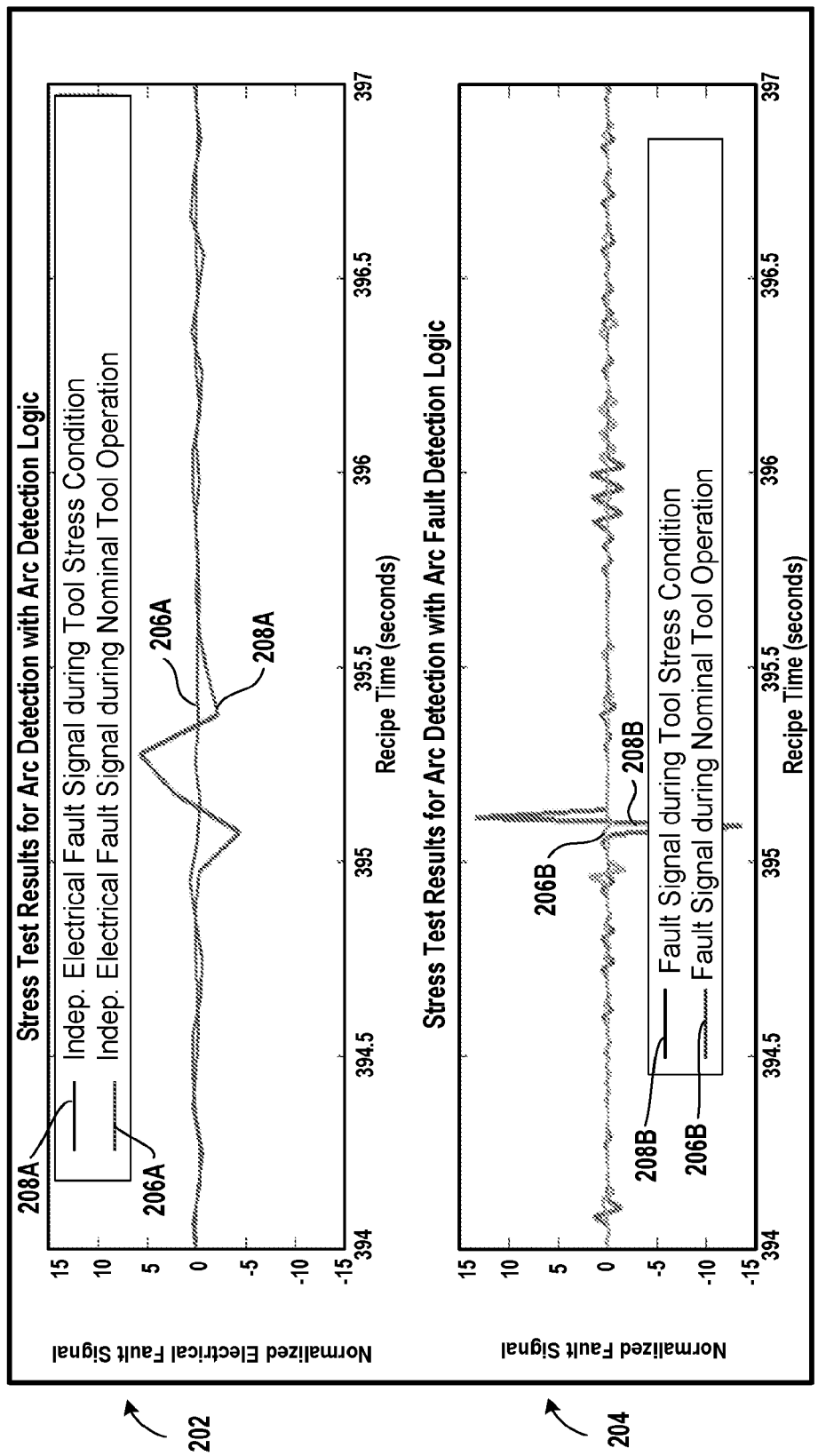
FIG. 2 shows multiple graphs to illustrate use of model compared to use of an arc detection sensor, in accordance with an embodiment described in the present disclosure.

FIG. 2 includes embodiments of graphs 202 and 204 to illustrate a use of a model compared to a use of an arc detection sensor. In some embodiments, an arc detection sensor is optically coupled to the ESC 152 (FIG. 1B) to detect an occurrence of an arcing event within the plasma chamber 112 (FIG. 1A). The graph 202 is generated by the CPU 158 (FIG. 1B) when an event or a fault is detected based on a variable that is measured by the arc detection sensor. The graph 204 is generated by the host system 162 when a fault or an event is determined by the CPU 158 based on the model 126 (FIG. 1A).

Each graph 202 and 204 plots a fault signal, e.g., a signal of a variable, etc., versus time. Each graph 202 and 204 plots a fault signal versus time for two different conditions, e.g., a tool stress condition and a nominal tool condition. For example, a plot 206A and a plot 206B are plotted when the plasma system 144 (FIG. 1B) is in a nominal tool condition, e.g., when a fault is not detected in the plasma system 144. As another example, a plot 208A and a plot 208B are plotted when the plasma system 144 is in a tool stress condition, e.g., when a fault is detected in the plasma system 144.

It should be noted that an event or a fault is readily detectable in the graph 204 compared to that in the graph 202. For example, a magnitude, e.g., an amplitude, etc., of a fault signal in the plot 208B at a time of an occurrence of a fault is larger than a magnitude of a fault signal in the plot 208A at a time of an occurrence of a fault. As another example, a peak-to-peak voltage of a fault signal in the plot 208B at a time of an occurrence of a fault is larger than a peak-to-peak voltage of a fault signal in the plot 208A at a time of an occurrence of a fault.

Also, it should be noted that a peak-to-peak voltage that indicates an event or a fault occurs in the plot 208B earlier than a peak-to-peak voltage that indicates an event or a fault in the plot 208A. This earlier indication of an event using a modeled approach saves time in detecting a fault or an event.

In some embodiments, the arc detection sensor is used in conjunction with the model 126 to confirm or deny an accuracy of an arc detection event. For example, when the arc detection sensor indicates that arcing of plasma has occurred, the model 126 is used to confirm or deny whether the arcing has occurred. As another example, when the model 126 indicates that an arcing event has occurred, the arc detection sensor is used to confirm an accuracy of the model 126.

Figure 3:
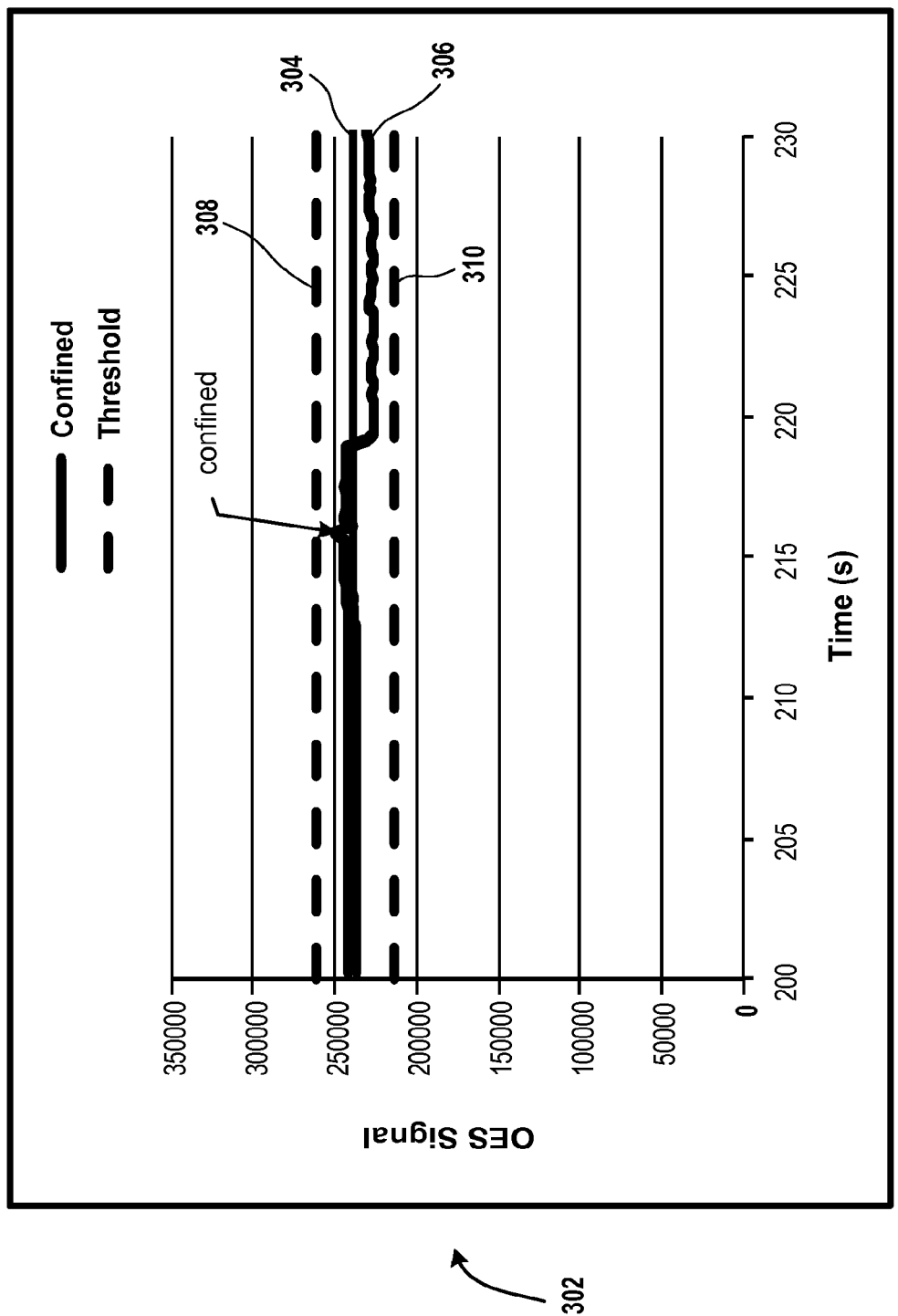
FIG. 3 is a graph that is used to illustrate a lack of detection of a fault or an event when a sensor is used for detection without using a model, in accordance with an embodiment described in the present disclosure.

FIG. 3 is an embodiment of a graph 302 that is used to illustrate a lack of detection of a fault when the OES meter is used for detection. The graph 302 plots multiple OES signals 304 and 306 that are generated by the OES meter versus time. The OES signal 304 is generated when plasma is confined in the plasma chamber 112 (FIG. 1A) and when there is less than a minimal amount of disturbance in plasma. Moreover, the OES signal 306 is generated when plasma is confined in the plasma chamber 112. It should be noted that there is a slight change in the OES signal 306 when a minimal amount of disturbance in plasma is detected. Moreover, neither an upper threshold 308 nor a lower threshold 310 is crossed during the confinement. Hence, a fault is not detected when the OES meter is used.

Figure 4:
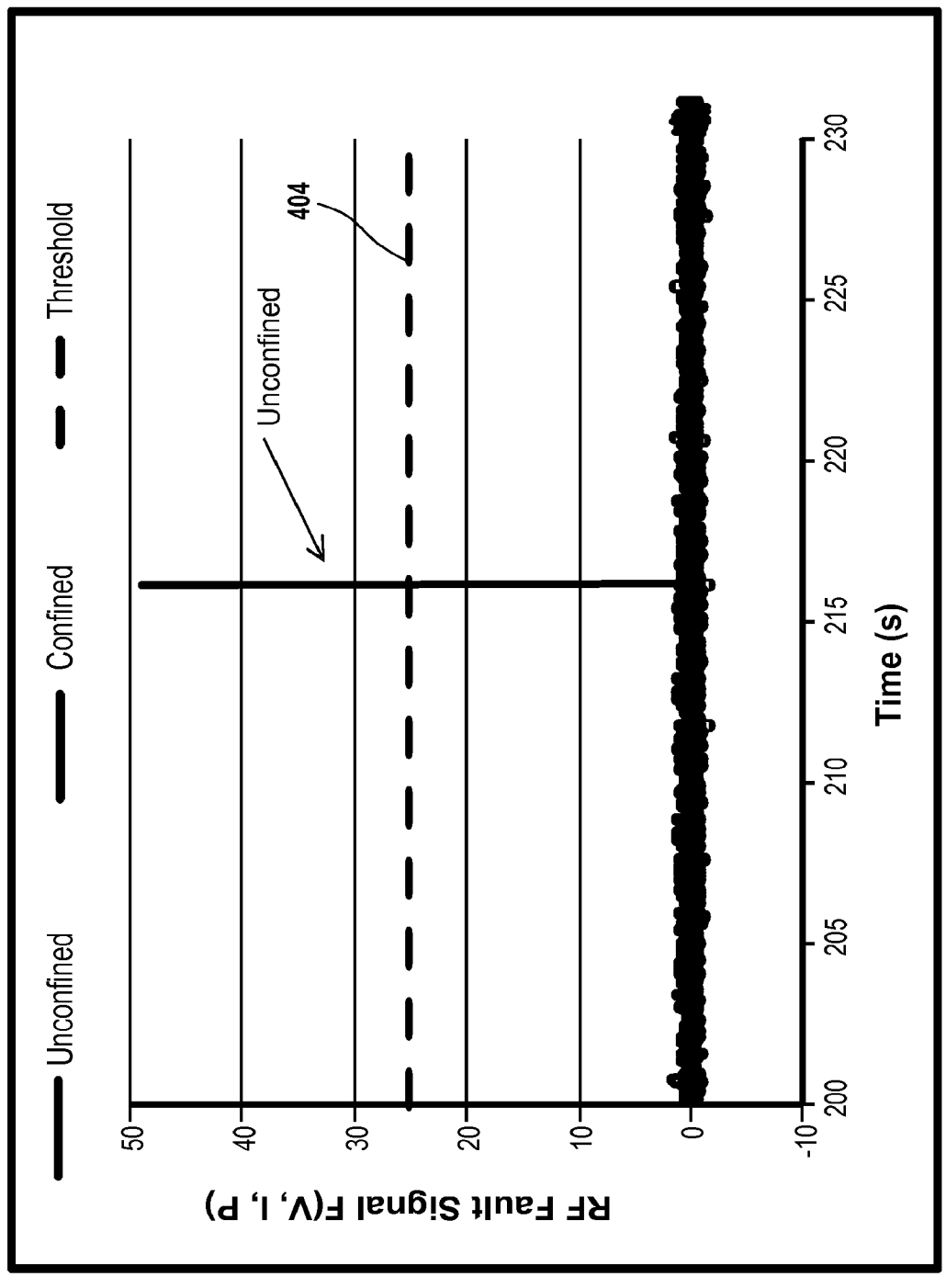
FIG. 4 is a graph to illustrate that use of a model provides a determinative indication of a fault or an event, in accordance with an embodiment described in the present disclosure.

FIG. 4 is an embodiment of a graph 402 to illustrate that use of the model 126 (FIG. 1A) provides a noticeable indication of a fault or an event. The graph 402 plots an RF fault signal, e.g., a signal of a variable, etc., versus time, which is measured in seconds (s). It should be noted that a noticeable indication of an unconfinement in plasma in the plasma chamber 112 (FIG. 1A) is indicated by the RF fault signal when the RF fault signal is greater than a threshold 404.

Figure 5:
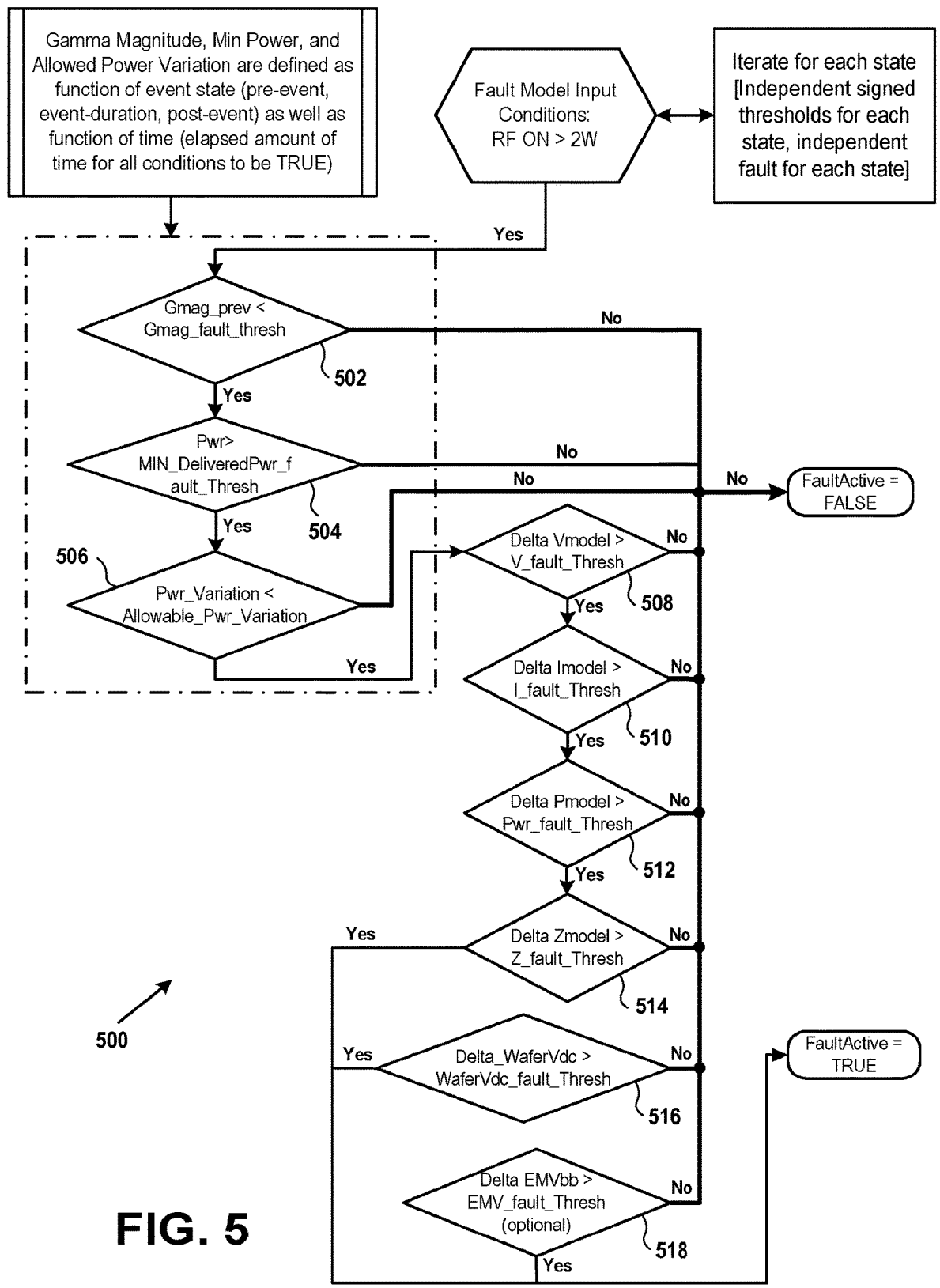
FIG. 5 is a flowchart of a method to detect a fault in a plasma system, in accordance with an embodiment described in the present disclosure.

FIG. 5 is a flowchart of an embodiment of a method 500 to detect a fault in the plasma system 144 (FIG. 1B). The method 500 is executed by the CPU 158 (FIG. 1B). As shown in the method 500, it is determined in an operation 502 whether a magnitude of gamma at a model node at the output of the model 126 (FIG. 1A) is less than a gamma magnitude threshold. In some embodiments, upon determining that the gamma magnitude is not less than the gamma magnitude threshold, it is determined that a fault does not exist in the plasma system 144. On the other hand, upon determining that the gamma magnitude is less than the gamma magnitude threshold, an operation 504 is performed.

In some embodiments, instead of the gamma magnitude, any other variable at the model node at the output of the model 126 is used in the operation 502 to determine whether the variable is less than a threshold.

In the operation 504, it is determined whether a minimum of multiple magnitudes of complex delivered power at the model node at the output of the model 126 is greater than a delivered power magnitude threshold. Upon determining that the minimum magnitude of complex delivered power is not greater than the delivered power magnitude threshold, it is determined that there is no fault in the plasma system 144. On the other hand, upon determining that the minimum magnitude of the complex delivered power is greater than a threshold, an operation 506 is performed.

In various embodiments, in the operation 504, instead of complex delivered power, complex forward power at the model node at the output of the model 126 is used to determine whether a magnitude of complex forward power is greater than a complex forward power threshold. In various embodiments, complex supplied power and complex forward power are used interchangeably herein.

In some embodiments, in the operation 504, instead of complex delivered power, complex reflected power at the model node at the output of the model 126 is used to determine whether a magnitude of complex reflected power is greater than a complex reflected power threshold.

In various embodiments, in the operation 504, instead of the minimum magnitude of complex delivered power, a maximum magnitude of the complex delivered power at the model node at the output of the model 126 is used to determine whether the maximum magnitude is greater than a delivered power magnitude threshold.

In some embodiments, in the operation 504, instead of complex delivered power, any other variable at the model node at the output of the model 126 is used to determine whether the variable is greater than a threshold.

In the operation 506, it is determined whether a variation in a magnitude of complex delivered power at the model node at the output of the model 126 is less than a variation threshold. Upon determining that the variation in the magnitude of complex delivered power is not less than the variation threshold, it is determined that a fault does not exist in the plasma system 144. On the other hand, upon determining that the variation in the magnitude of complex delivered power is less than the variation threshold, an operation 508 is performed.

In some embodiments, instead of the variation in the magnitude of complex delivered power, a variation in a magnitude of complex supplied power at the model node at the output of the model 126 is used in the operation 506 to determine whether the variation in the magnitude of complex supplied power is less than a complex supplied power variation threshold. In various embodiments, instead of the variation in the magnitude of complex delivered power, a variation in a magnitude of complex reflected power at the model node at the output of the model 126 is used in the operation 506 to determine whether the variation in the magnitude of complex reflected power is less than a complex reflected power variation threshold.

In a number of embodiments, in the operation 506, instead of a variation in complex delivered power, a variation in another variable at the model node at the output of the model 126 is used to determine whether the variation in the other variable is less than a threshold.

It should be noted that the operations 502, 504, and 506 are designated as pre-fault determination operations or as pre-event determination operations.

In some embodiments, instead of three comparisons performed in the three operations 502, 504, and 506, any number of comparisons, e.g., one, two, four, six, etc., of variables and corresponding thresholds and/or variations in variables and corresponding variation thresholds are performed. For example, a comparison is performed between a complex supplied power and a complex supplied power threshold in an operation between the operations 502 and 504.

In the operation 508, it is determined whether a change in a magnitude of a complex voltage at the model node at the output of the model 126 is greater than a complex voltage change threshold. Upon determining that the change in the magnitude of complex voltage is not greater than the complex voltage change threshold, it is determined that a fault does not exist in the plasma system 144. On the other hand, upon determining that the change in the magnitude of complex voltage is greater than the complex voltage change threshold, an operation 510 is performed.

In a number of embodiments, in the operation 508, instead of the change in the magnitude of complex voltage, a change in another variable at the model node at the output of the model 126 is used to determine whether the change in the other variable is greater than a threshold.

In the operation 510, it is determined whether a change in a magnitude of a complex current at the model node at the output of the model 126 is greater than a complex current change threshold. Upon determining that the change in the magnitude of complex current is not greater than the complex current change threshold, it is determined that a fault does not exist in the plasma system 144. On the other hand, upon determining that the change in the magnitude of complex current is greater than the complex current change threshold, an operation 512 is performed.

In a number of embodiments, in the operation 510, instead of the change in the magnitude of complex current, a change in another variable at the model node at the output of the model 126 is used to determine whether the change in the other variable is greater than a threshold.

In the operation 512, it is determined whether a change in a magnitude of complex supplied power at the model node at the output of the model 126 is greater than a complex supplied power change threshold. Upon determining that the change in the magnitude of complex supplied power is not greater than the complex supplied power change threshold, it is determined that a fault does not exist in the plasma system 144. On the other hand, upon determining that the change in the magnitude of complex supplied power is greater than the complex supplied power change threshold, an operation 514 is performed.

In a number of embodiments, in the operation 512, instead of the change in the magnitude of complex supplied power, a change in another variable, e.g., magnitude of complex delivered power, magnitude of complex reflected power, etc., at the model node at the output of the model 126 is used to determine whether the change in the other variable is greater than a threshold.

In the operation 514, it is determined whether a change in a magnitude of complex impedance at the model node at the output of the model 126 is greater than a complex impedance threshold. Upon determining that the change in the magnitude of complex impedance is not greater than the complex impedance threshold, it is determined that a fault does not exist in the plasma system 144. On the other hand, upon determining that the change in the magnitude of complex impedance greater than the complex impedance threshold, an operation 516 is performed.

In a number of embodiments, in the operation 514, instead of the change in the magnitude of complex impedance, a change in another variable at the model node at the output of the model 126 is used to determine whether the change in the other variable is greater than a threshold.

In the operation 516, it is determined whether a change in a model bias at the model node at the output of the model 126 is greater than a bias threshold. Upon determining that the change in the model bias is not greater than the bias threshold, it is determined that a fault does not exist in the plasma system 144. On the other hand, upon determining that the change in the model bias is greater than the bias threshold, it is determined that a fault exists in the plasma system 144.

In a number of embodiments, in the operation 516, instead of the change in the model bias, a change in another variable at the model node at the output of the model 126 is used to determine whether the change in the other variable is greater than a threshold.

In some embodiments, in an operation 518, it is determined whether a change in a variable that is measured by an external monitor, e.g., the OES meter, a voltage sensor, a current sensor, a power sensor, etc., coupled, e.g., optically, electrically, etc., to the ESC 152, e.g., output of the ESC 152, input of the ESC 152, etc., is greater than a threshold. For example, the OES meter senses optical emission of plasma that is within the plasma chamber 156 (FIG. 1B) to generate electrical signals representative of plasma charge values. Upon determining that the change in the measured variable is not greater than a threshold, it is determined that a fault does not exist in the plasma system 144. On the other hand, upon determining that the change in the measured variable is greater than the threshold, it is determined that a fault exists in the plasma system 144.

In various embodiments, the operation 518 is performed in addition to performing one or more of the operations 502, 504, 506, 508, 510, 512, 514, and 516 to determine whether a fault exists in the plasma system 144. For example, the operation 518 is used to confirm that a fault exists in the plasma system 144.

In some embodiments, the operation 518 is optional and is not performed within the method 500 to determine whether a fault exists in the plasma system 144.

In various embodiments, one or more of the operations 502, 504, 506, 508, 510, 512, 514, 516, and 518 are performed to determine whether a fault exists in the plasma system 144.

It should be noted that in several embodiments, one or more of the operations 502, 504, 506, 508, 510, 512, 514, 516, and 518 are repeated by the CPU 158 for a predetermined number of times to determine whether an event has occurred in the plasma system 144. Upon determining by the CPU 158 that a fault exists in the plasma system 144 for the number of times one or more of the operations 502, 504, 506, 508, 510, 512, 514, 516, and 518 are repeated by the CPU 158, it is determined by the CPU 158 that an event has occurred in the plasma system 144. On the other hand, upon determining by the CPU 158 that the fault does not exist in the plasma system 144 for the number of times one or more of the operations 502, 504, 506, 508, 510, 512, 514, 516, and 518 are repeated, it is determined by the CPU 158 that an event has not occurred in the plasma system 144.

It should be noted that in several embodiments, one or more of the operations 502, 504, 506, 508, 510, 512, 514, 516, and 518 are repeated by the CPU 158 for a pre-determined time period to determine whether an event has occurred in the plasma system 144. Upon determining by the CPU 158 that a fault exists in the plasma system 144 for the pre-determined time period for which one or more of the operations 502, 504, 506, 508, 510, 512, 514, 516, and 518 are repeatedly performed, it is determined by the CPU 158 that an event has occurred in the plasma system 144. On the other hand, upon determining by the CPU 158 that the fault does not exist in the plasma system 144 for the pre-determined time period for which one or more of the operations 502, 504, 506, 508, 510, 512, 514, 516, and 518 are repeatedly performed, it is determined by the CPU 158 that an event has not occurred in the plasma system 144.

It should be noted that the operations 508, 510, 512, 514, 516, and 518 are designated as fault determination operations or event determination operations.

In some embodiments, the pre-fault determination operations occur during striking of plasma and the fault determination operations are performed when the plasma is in a steady state, e.g., after being stricken and generated, etc. In several embodiments, the pre-fault determination operations occur during striking of plasma and also during a transition of a time period from the striking of plasma to the plasma reaching a steady state, and the fault determination operations are performed when the plasma is in the steady state. In various embodiments, the pre-fault determination operations occur during a time period immediately before a transition from a first state, e.g., S1, S0, etc., and continue through the transition until a steady state of a second state, e.g., S0, S1, etc., is reached and the fault determination operations occur during the steady state. The second state sequentially follows the first state. An example of the time period immediately before the transition includes a time window in which a change in a power level of an RF signal that is generated by one of the RF generators 116 (FIG. 1A) occurs. The change in the power level occurs to change a state of the RF signal from the state S1 to the state S0 or from the state S0 to the state S1. Another example of the time period immediately before the transition includes a portion of the state S1 or the state S0.

In some embodiments, a threshold window during the time period immediately before the transition from a first state to a second state is modified by the CPU 158 to be different from a threshold window during the transition. For example, a threshold value of a variable during the transition is changed by the CPU 158 to be greater than a threshold value of the variable during the time period immediately before the transition. There is a change in a state of an RF signal occurring during the transition. A modification of the threshold window allows for the change in the state to occur without triggering a false alarm of a fault.

In various embodiments, the pre-fault determination operations are performed to determine whether there is a fault in the plasma system 144. In these embodiments, the fault determination operations are not performed. For example, a plasma dropout fault is determined based on the pre-fault determination operations without performing the fault determination operations. As another example, a plasma instability fault is determined based on the pre-fault determination operations without performing the fault determination operations.

In some embodiments, instead of six comparisons performed in the six operations 508, 510, 512, 514, 516, and 518, any number of comparisons, e.g., one, two, four, five, seven, ten, etc., are performed. For example, a comparison is performed between an ion energy and an ion energy threshold in an operation between the operations 510 and 512.

In some embodiments, the operations of the method 500 are performed in a different order than that shown in FIG. 5. For example, the operation 512 is performed before the operation 510 or simultaneous with the operation 510. As another example, the operation 514 is performed after or simultaneous with the operation 516.

It is further noted that in some embodiments, the method 500 is repeated by the CPU 158 for different states of a pulsed signal of an RF generator. For example, the operations 502, 504, 506, 508, 510, 512, 514, 516, and 518 are performed by the CPU 158 for the state S0 of a pulsed signal and are repeated by the CPU 158 for the state S1 of the pulsed signal.

In various embodiments, a different threshold is used for each state of a pulsed signal of an RF generator. For example, a threshold value of a variable is used in the operation 508 for the state S1 of an RF pulsed signal and a different threshold value is used in the operation 508 for the state S0 of the pulsed signal. As another example, a variation threshold value is used in the operation 508 for the state S0 of an RF pulsed signal and a different variation threshold value is used in the operation 508 for the state S1 of the pulsed signal.

In some embodiments, a different value of a variation threshold is used for a variable during one of the event determination operations than a value of a variation threshold for the variable used during one of the pre-event determination operations. For example, a threshold power variation used during the operation 512 is different than a threshold power variation used during the operation 506. In various embodiments, a different value of a threshold is used for a variable during one of the event determination operations than a value of a threshold for the variable used during one of the pre-event determination operations.

It is further noted that in various embodiments, the method 500 is repeated by the CPU 158 for the same state of a continuous wave RF signal generated by an RF generator. For example, the operations 502, 504, 506, 508, 510, 512, 514, 516, and 518 are performed by the CPU 158 for the state S0 of a continuous wave RF signal and are repeated thereafter by the CPU 158 for the state S0 of the continuous wave RF signal. As another example, the operations 502, 504, 506, 508, 510, 512, 514, 516, and 518 are performed by the CPU 158 for the state S1 of a continuous wave RF signal and are repeated thereafter by the CPU 158 for the state S1 of the continuous wave RF signal.

In several embodiments, an existence of a fault during the state S1 is independently determined by the CPU 158 of an existence of a fault during the state S0. For example, when it is determined by the CPU 158 that a fault exists based on use of a threshold and/or a variation threshold associated with a variable during the state S1 of an RF signal, it is determined by the CPU 158 that a fault does not exist based on use of an additional threshold and/or an additional variation threshold associated with the variable during the state S0 of the RF signal. As another example, when it is determined by the CPU 158 that a fault exists based on use of a threshold and/or a variation threshold associated with a variable during the state S0 of an RF signal, it is determined by the CPU 158 that a fault does not exist based on use of an additional threshold and/or an additional variation threshold associated with the variable during the state S1 of the RF signal.

In various embodiments, a fault exists in the plasma system 144 when the fault is determined by using the method 500 during both the states S1 and S0 of an RF pulsed signal. In several embodiments, a fault does not exist within the plasma system 144 when the fault is determined using the method 500 during both states S1 and S0 of an RF pulsed signal.

In various embodiments, a value of a variable fails to satisfy or meet a threshold when the value is greater than the threshold and it is pre-determined by the CPU 158 (FIG. 1B) that the value is to be less than or equal to the threshold. In several embodiments, a value of a variable fails to satisfy or meet a threshold when the value is less than the threshold and it is pre-determined by the CPU 158 that the value is to be greater than or equal to the threshold.

Figure 6:
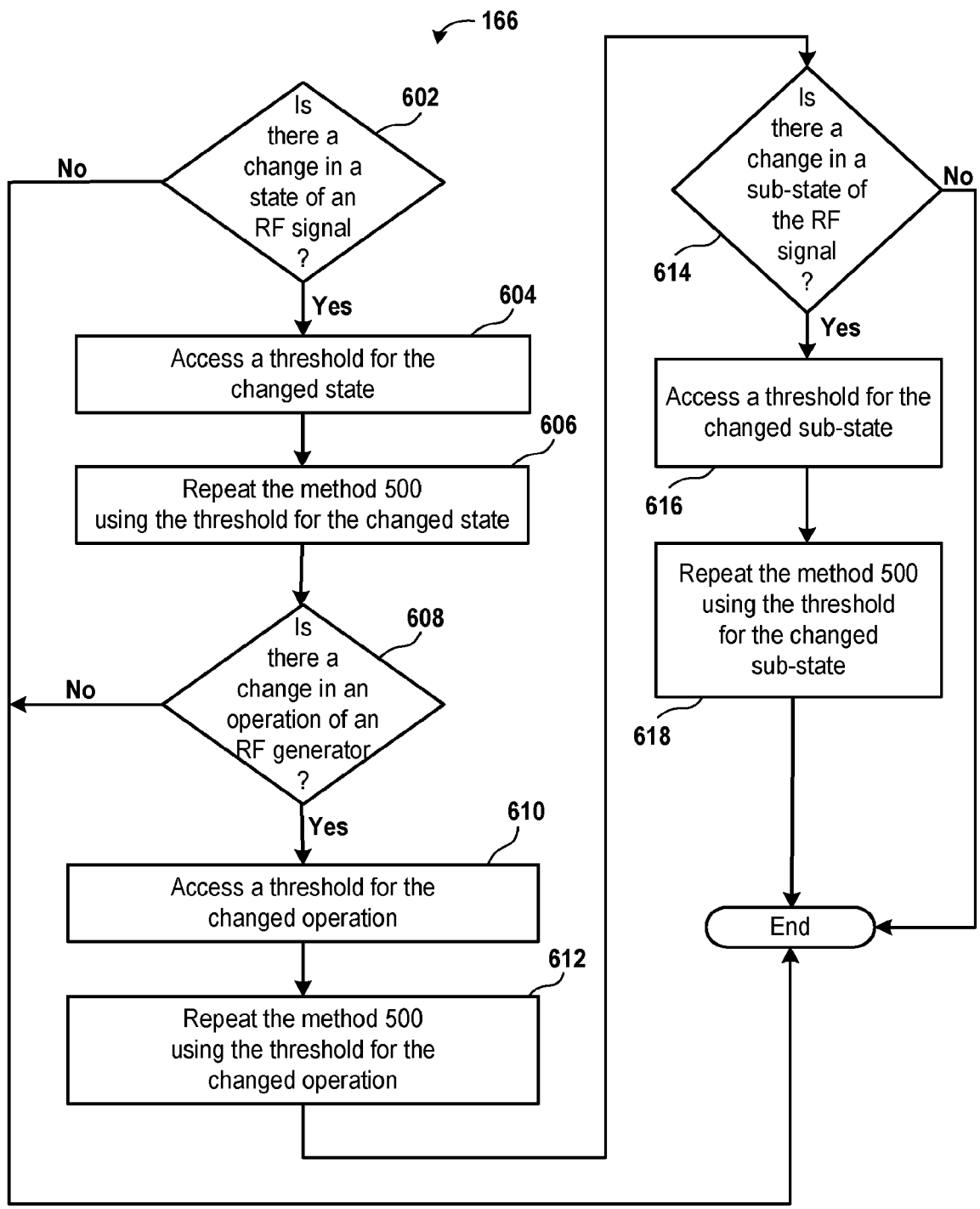
FIG. 6 is a flowchart of a method illustrating a change in one or more thresholds and/or one or more variation thresholds based on a state of an RF signal, a change in an operation of an RF generator, and/or a change in a sub-state of the RF signal, in accordance with an embodiment described in the present disclosure.

FIG. 6 is a flowchart of an embodiment of a method 600 illustrating a change in one or more thresholds and/or one or more variation thresholds based on a state of an RF signal, a change in an operation of one of the RF generators 146 (FIG. 1B), and a change in a sub-state of the RF signal. The method 600 is executed by the CPU 158 (FIG. 1B). The method 600 is executed during execution of the method 500 (FIG. 5).

In an operation 602 of the method 600, the CPU 158 determines whether RF signals generated by the RF generators 146 transition from the state S1 to the state S0 or from the state S0 to the state S1 or from the state S0 to a transition state between the states S0 and S1 or from the state S1 to a transition state between the states S1 and S0. For example, the CPU 158 identifies from the memory device of the host system 162 (FIG. 1B) that a power level setting of an RF signal that is generated by one of the RF generators 146 has changed from a power level setting corresponding to the state S0 to a power level setting corresponding to the state S1 to determine that there is a change in a state of the RF signal from the state S0 to the state S1. As another example, the CPU 158 identifies from the memory device of the host system 162 that a power level setting is increasing at a pre-determined rate from a power level for the state S0 to determine that there is a change in a state of an RF signal that is generated by one of the RF generators 146 from the state S0 to a transition state. As yet another example, the CPU 158 identifies from the memory device of the host system 162 that a power level setting is decreasing at a pre-determined rate from a power level for the state S1 to determine that there is a change in a state of an RF signal that is generated by one of the RF generators 146 from the state S1 to a transition state.

It should be noted that in some embodiments, a power level setting for each state S1, S0, etc., is received by CPU 158 from the user via an input device of the host system 162. Examples of the input device of the host system 162 are the same as that of the input device of the host system 120 (FIG. 1A).

The determination of the state transition is made during execution of the method 500. For example, the CPU 158 determines whether RF signals generated by the RF generators 146 transition between the states S1 and S0 during performance of the operation 502 (FIG. 5), or the operation 504, or the operation 506, or the operation 508, or the operation 510, or the operation 512, or the operation 514, or the operation 516, or the operation 518, or between performance of the operations 502 and 504, or between performance of the operations 504 and 506, or between performance of the operations 506 and 508, or between performance of the operations 508 and 510, or between performance of the operations 510 and 512, or between performance of the operations 512 and 514, or between performance of the operations 514 and 516, or between performance of the operations 516 and 518.

Upon determining from the operation 602 that the state of the RF signals changes, in an operation 604, the CPU 158 accesses from the memory device of the host system 120 (FIG. 1A) one or more thresholds and/or one or more variations thresholds for the changed state, e.g., the state S1, the state S0, a transition state, etc. For example, upon determining that the state of the RF signals has changed during performance of the operation 502, the CPU 158 reads from the memory device of the host system 162 a gamma magnitude threshold for use during the operation 502, a delivered power threshold for use during the operation 504, a power variation threshold for use during the operation 506, a voltage variation threshold for using during the operation 508, a current variation threshold for use during the operation 510, a power variation threshold for use during the operation 512, an impedance variation threshold for use during the operation 514, a wafer bias variation threshold for use during the operation 516, and a variation threshold for use during the operation 518.

In an operation 606 of the method 600, the method 500 is repeated by the CPU 158 using the one or more thresholds and/or one or more variation thresholds that are accessed during the operation 604. For example, the operation 502 is repeated using the gamma magnitude threshold accessed during the operation 604, the operation 504 is repeated using the delivered power threshold accessed during the operation 604, the operation 506 is repeated using the power variation threshold accessed during the operation 604, the operation 508 is repeated using the voltage variation threshold accessed during the operation 604, the operation 510 is repeated using the current variation threshold accessed during the operation 604, the operation 512 is repeated using the power variation threshold accessed during the operation 604, the operation 514 is repeated using the impedance variation threshold accessed during the operation 604, the operation 516 is repeated using the wafer bias variation threshold accessed during the operation 604, and the operation 518 is repeated using the variation threshold accessed during the operation 604.

In another operation 608 of the method 600, the CPU 158 determines whether an operation of one or more of the RF generators 116 has changed. For example, it is identified from the memory device of the host system 162 whether the one of the RF generators 146 is turned off or turned on. It should be noted that when an RF generator is turned off, in some embodiments, the RF generator does not supply an RF signal and when the RF generator is turned on, the RF generator supplies the RF signal.

The operation 608 is performed during execution of the method 500. For example, the operation 608 is executed during execution of any of the operations 502, 504, 506, 508, 510, 512, 514, 516, and 518 or during execution of the method 500 between any two of the operations 502, 504, 506, 508, 510, 512, 514, 516, and 518.

Upon determining that the operation of one or more of the RF generators 146 has changed, in an operation 610, the CPU 158 accesses one or more thresholds and/or one or more variations thresholds for the changed operation. The operation 610 is similar to the operation 604 except that the one or more thresholds that are accessed during the operation 610 are mapped in the memory device of the host system 162 to the changed operation of the one or more of the RF generators 146. For example, there is a virtual link in the memory device of the host system 162 between a threshold and an operation, e.g., turned on, turned off, etc., of one of the RF generators 146 and the virtual link is stored in the memory device of the host system 162.

Moreover, an operation 612 of the method 600 is similar to the operation 608 except that during the operation 612, the method 500 is repeated by the CPU 158 using the one or more thresholds and/or one or more variation thresholds that are accessed during the operation 610. During the operation 612, instead of using thresholds for an operational state of one or more of the RF generators 146 before the change in the operation of the one or more of the RF generators 146, the one or more thresholds for the changed operation are used to execute the method 500.

In an operation 614 of the method 600, the CPU 158 determines whether there is a change in a sub-state, e.g., S01, S02, S03, S11, S12, S13, etc., of an RF signal that is generated by one of the RF generators 146. For example, the CPU 158 identifies from the memory device of the host system 162 a power level setting of an RF signal that is generated one of the RF generators 146 to determine whether there is a change in the sub-state of the RF signal. As another example, the CPU 158 determines whether the sub-state changes from a first sub-state to a second sub-state that consecutively follows the first sub-state. To further illustrate, the CPU 158 determines whether the sub-state changes from the sub-state S01 to the sub-state S02. As another illustration, the CPU 158 determines whether the sub-state changes from S12 to S13. The operation 614 is performed during execution of the method 500.

Figure 7:
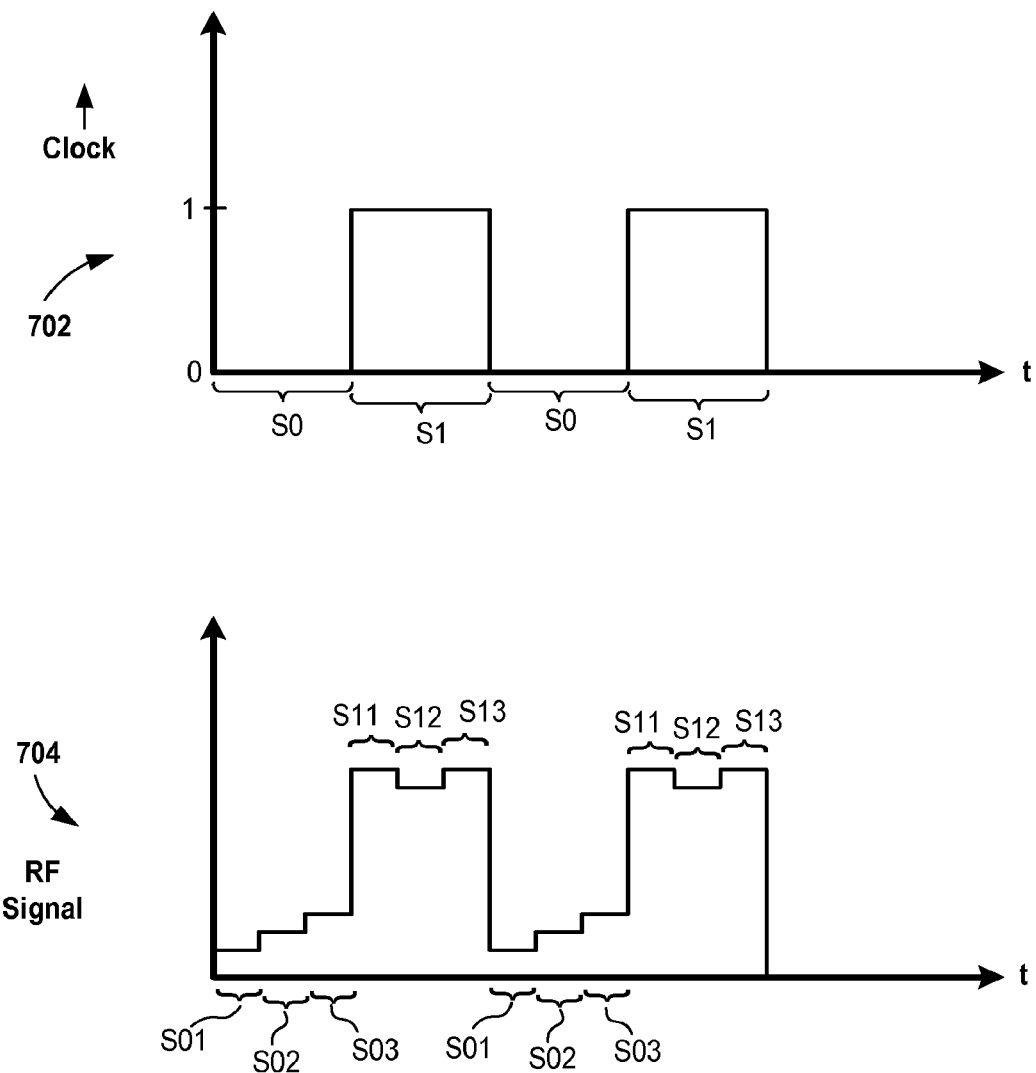
FIG. 7 shows multiple graphs to illustrate sub-states of an RF signal, in accordance with an embodiment described in the present disclosure.

Examples of the sub-state are provided in FIG. 7. FIG. 7 shows an embodiment of a graph 702 and an embodiment of another graph 704. The graph 702 plots a clock signal versus time t. The clock signal is generated by a clock source, e.g., an oscillator, an oscillator with a phase locked loop, etc., of the host system 162 (FIG. 1B), and is provided to one or more of the RF generators 146 (FIG. 1B) to synchronize generation of one or more RF signals that are generated by the corresponding one or more of the RF generators 146. In some embodiments, the clock signal is generated by a master RF generator, e.g., the x MHz RF generator, etc., for providing to the y and z MHz RF generators to synchronize generation of RF signals that are generated by the x, y, and z MHz RF generators. Moreover, the graph 794 plots an RF signal that is generated by one of the RF generators 146 versus the time t.

As shown, during the state S0 of the clock signal 702, a power level of the RF signal 704 is changed by one of the RF generators 146 that generates the RF signal 704 from being associated with the state S01 to being associated with the state S02 and further changed from being associated with the state S02 to being associated with the state S03. Similarly, during the state S1 of the clock signal 702, a power level of the RF signal 704 is changed by one of the RF generators 146 that generates the RF signal 704 from being associated with the sub-state S11 to being associated with the sub-state S12 and is further changed from being associated with the sub-state S12 to being associated with the sub-state S13.

It should be noted that a power level associated with a first sub-state, e.g., the sub-state S02, etc., that consecutively follows a second sub-state, e.g., the sub-state S01, etc., is different than, e.g., exclusive from, etc., the power level associated with the second sub-state. In some embodiments, a power level associated with the sub-state S03 is the same as the power level associated with the sub-state S01.

Upon determining from the operation 614 that there is a change in the sub-state of an RF signal generated by one of the RF generators 146, in an operation 616, the CPU 158 accesses one or more thresholds and/or one or more variation thresholds for the changed sub-state from the memory device of the host system 162. The operation 616 is similar to the operation 604 except that during the operation 616, one or more thresholds and/or one or more variation thresholds that are mapped to the changed sub-state are accessed from the memory device of the host system 162.

In an operation 618 of the method 600, the CPU 158 repeats the method 500 using the one or more thresholds and/or one or more variation thresholds that are accessed during the operation 616. For example, instead of using thresholds for an operational state of one or more of the RF generators 162 before the change in the sub-state of an RF signal that is generated by one of the RF generators 162, the one or more thresholds for the changed sub-state are used to execute the method 500.

It should be noted that although the above-described embodiments relate to providing an RF signal to the lower electrode of the chuck 136 (FIG. 1A) and grounding the upper electrode 134 (FIG. 1A), in several embodiments, the RF signal is provided to the upper electrode 134 while the lower electrode of the chuck 136 is grounded. In some embodiments, a fault and a potential fault are used interchangeably herein.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for controlling a plasma system, comprising:
setting a radio frequency (RF) generator to supply RF power in synchronization with a plurality of states of a clock signal, wherein the plurality of states of the clock signal repeat continuously, wherein the plurality of states occur during a cycle of the clock signal and the RF power transitions between a plurality of power levels during the plurality of states, wherein the RF power has a plurality of sub-states that occur during at least one of the plurality of states of the clock signal, wherein the RF power transitions between a first power level and a second power level during the plurality of sub-states;

receiving data associated with the supply of the RF power from the RF generator, wherein the data is received for the plurality of sub-states;

accessing a computer-generated model of one or more of a plurality of parts of the plasma system, wherein the plurality of parts include an RF cable and an impedance matching circuit, wherein the RF cable is coupled between the impedance matching circuit and the RF generator;

propagating the data through the computer-generated model to produce model data at an output of the computer-generated model, wherein the model data is associated with the plurality of sub-states;

examining the model data for the plurality of sub-states for a fault, wherein said examining the model data for the plurality of sub-states includes comparing a first portion of the model data to a first threshold for one of the plurality of sub-states and comparing a second portion of the model data to a second threshold for another one of the plurality of sub-states; and controlling a portion of the plasma system based on the fault.

2. The method of claim 1, wherein the plurality of states of the clock signal include a first state and a second state, wherein the first state has a logic level of one and the second state has a logic level of zero, wherein a first instance of the second state sequentially follows a first instance of the first state, wherein a second instance of the first state sequentially follows the first instance of the second state.

3. The method of claim 1, wherein the first power level is different than the second power level.

4. The method of claim 1, wherein the data associated with the supply of the RF power includes a plurality of values of a complex voltage and current measured at an output of the RF generator.

5. The method of claim 1, wherein the computer-generated model has similar characteristics to that of the one or more of the plurality of parts of the plasma system, wherein the computer-generated model includes a plurality of elements coupled between an input node of the computer-generated model and an output node of the computer-generated model.

6. The method of claim 5, wherein said propagating the data comprises propagating the data from the input node via the plurality of elements of the computer-generated model to output the model data at the output node.

7. The method of claim 1, wherein the computer-generated model is of the RF cable and the impedance matching circuit.

8. The method of claim 1, wherein the model data includes a plurality of values of a complex voltage and current for the plurality of sub-states.

9. The method of claim 1, wherein said examining the model data includes:

determining whether the first portion of the model data crosses the first threshold;

determining whether the second portion of the model data crosses the second threshold;

determining whether a variation in the first portion of the model data crosses a first variation threshold; and determining whether a variation in the second portion of the model data crosses a second variation threshold.

10. The method of claim 1, wherein controlling the portion of the plasma system based on the fault comprises controlling the RF power of the RF generator to resolve the fault.

11. A plasma system comprising:

a radio frequency (RF) generator configured to supply RF power in synchronization with a plurality of states of a clock signal, wherein the plurality of states of the clock signal repeat continuously, wherein the plurality of states occur during a cycle of the clock signal and the RF power transitions between a plurality of power levels during the plurality of states, wherein the RF power has a plurality of sub-states that occur during at least one of the plurality of states of the clock signal, wherein the RF power transitions between a first power level and a second power level during the plurality of sub-states;

an impedance matching circuit coupled to the RF generator via an RF cable; and a host computer coupled to the RF generator, wherein the host computer is configured to:

receive data associated with the supply of the RF power from the RF generator, wherein the data is received for the plurality of sub-states;

access a computer-generated model of one or more of a plurality of parts of the plasma system, wherein the plurality of parts include the RF cable and the impedance matching circuit;

propagate the data through the computer-generated model to produce model data at an output of the computer-generated model, wherein the model data is associated with the plurality of sub-states;

examine the model data for the plurality of sub-states for a fault, wherein to examine the model data for the plurality of sub-states, a first portion of the model data is compared to a first threshold for one of the plurality of sub-states and a second portion of the model data is compared to a second threshold for another one of the plurality of sub-states; and control a portion of the plasma system based on the fault.

12. The plasma system of claim 11, wherein the plurality of states of the clock signal include a first state and a second state, wherein the first state has a logic level of one and the second state has a logic level of zero, wherein a first instance of the second state sequentially follows a first instance of the first state, wherein a second instance of the first state sequentially follows the first instance of the second state.

13. The plasma system of claim 11, wherein the first power level is different than the second power level.

14. The plasma system of claim 11, wherein the data associated with the supply of the RF power includes a plurality of values of a complex voltage and current measured at an output of the RF generator.

15. The plasma system of claim 11, wherein the computer-generated model has similar characteristics to that of the one or more of the plurality of parts of the plasma system, wherein the computer-generated model includes a plurality of elements coupled between an input node of the computer-generated model and an output node of the computer-generated model.

16. The plasma system of claim 15, wherein the host computer system is configured to propagate the data from the input node via the plurality of elements of the computer-generated model to output the model data at the output node.

17. The plasma system of claim 11, wherein the computer-generated model is of the RF cable and the impedance matching circuit.

18. The plasma system of claim 11, wherein the model data includes a plurality of values of a complex voltage and current for the plurality of sub-states.

19. The plasma system of claim 11, wherein to examine the model data, the host computer is configured to:
determine whether the first portion of the model data crosses the first threshold;
determine whether the second portion of the model data crosses the second threshold;
determine whether a variation in the first portion of the model data crosses a first variation threshold; and
determine whether a variation in the second portion of the model data crosses a second variation threshold.

20. The plasma system of claim 11, wherein the host computer system is configured to control the RF power of the RF generator to resolve the fault.

21. A controller comprising:
a processor configured to:
set a radio frequency (RF) generator to supply RF power in synchronization with a plurality of states of a clock signal, wherein the plurality of states of the clock signal repeat continuously, wherein the plurality of states occur during a cycle of the clock signal and the RF power transitions between a plurality of power levels during the plurality of states, wherein the RF power has a plurality of sub-states that occur during at least one of the plurality of states of the clock signal, wherein the RF power transitions between a first power level and a second power level during the plurality of sub-states;
receive data associated with the supply of the RF power from the RF generator, wherein the data is received for the plurality of sub-states;
access a computer-generated model of one or more of a plurality of parts of a plasma system, wherein the plurality of parts include an RF cable and an impedance matching circuit, wherein the RF cable is coupled between the impedance matching circuit and the RF generator;
propagate the data through the computer-generated model to produce model data at an output of the computer-generated model, wherein the model data is associated with the plurality of sub-states;
examine the model data for the plurality of sub-states for a fault, wherein to examine the model data for the plurality of sub-states, a first portion of the model data is compared to a first threshold for one of the plurality of sub-states and a second portion of the model data is compared to a second threshold for another one of the plurality of sub-states; and
control a portion of the plasma system based on the fault; and
a memory device coupled to the processor, wherein the memory device is configured to store the computer-generated model.

22. The controller of claim 21, wherein the plurality of states of the clock signal includes a first state and a second state, wherein the first state has a logic level of one and the second state has a logic level of zero, wherein a first instance of the second state sequentially follows a first instance of the first state, wherein a second instance of the first state sequentially follows the first instance of the second state.

23. The controller of claim 21, wherein the first power level is different from the second power level.

24. The controller of claim 21, wherein the data associated with the supply of the RF power includes a plurality of values of a complex voltage and current measured at an output of the RF generator.

25. The controller of claim 21, wherein the computer-generated model has similar characteristics to that of the one or more of the plurality of parts of the plasma system, wherein the computer-generated model includes a plurality of elements coupled between an input node of the computer-generated model and an output node of the computer-generated model.

26. The controller of claim 25, wherein the processor is configured to propagate the data from the input node via the plurality of elements of the computer-generated model to output the model data at the output node.

27. The controller of claim 21, wherein the computer-generated model is of the RF cable and the impedance matching circuit.

28. The controller of claim 21, wherein the model data includes a plurality of values of a complex voltage and current for the plurality of sub-states.

29. The controller of claim 21, wherein to examine the model data, the processor is configured to:
determine whether the first portion of the model data crosses the first threshold;
determine whether the second portion of the model data crosses the second threshold;
determine whether a variation in the first portion of the model data crosses a first variation threshold; and
determine whether a variation in the second portion of the model data crosses a second variation threshold.

30. The controller of claim 21, wherein the processor is configured to control the RF power of the RF generator to resolve the fault.

* * * * *